US012713835B2

(12) United States Patent
Apalkov et al.

(10) Patent No.: US 12,713,835 B2
(45) Date of Patent: Aug. 18, 2026

(54) PERPENDICULAR SHAPE ANISOTROPY DESIGN WITH ASYMMETRIC COMPOSITE FREE LAYER

(71) Applicant: Samsung Electronics Co., Ltd., Suwon-si (KR)

(72) Inventors: Dmytro Apalkov, San Jose, CA (US); Roman Chepulskyy, Milpitas, CA (US); Jaewoo Jeong, San Jose, CA (US); Fnu Ikhtiar, San Jose, CA (US); Sungchul Lee, Osan-Si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 468 days.

(21) Appl. No.: 18/116,835

(22) Filed: Mar. 2, 2023

(65) Prior Publication Data

US 2024/0237542 A1 Jul. 11, 2024

Related U.S. Application Data

(60) Provisional application No. 63/437,359, filed on Jan. 5, 2023.

(51) Int. Cl.
*H10N 50/10* (2023.01)
*G11C 11/16* (2006.01)
(Continued)

(52) U.S. Cl.
CPC ........... *H10N 50/10* (2023.02); *G11C 11/161* (2013.01); *H01F 10/3286* (2013.01);
(Continued)

(58) Field of Classification Search
CPC .......................... G11C 11/161; H01F 10/3286
See application file for complete search history.

(56) References Cited

U.S. PATENT DOCUMENTS 6,833,573 B1 12/2004 Worledge
8,089,803 B2 1/2012 Katou
(Continued)

FOREIGN PATENT DOCUMENTS

CN 106876581 A 6/2017
WO 2018224928 A1 12/2018

OTHER PUBLICATIONS

Office Action for U.S. Appl. No. 18/116,836, mailed Dec. 19, 2025.
(Continued)

*Primary Examiner* — Shih Tsun A Chou
(74) *Attorney, Agent, or Firm* — Renaissance IP Law Group LLP

(57) ABSTRACT

A perpendicular shape anisotropy magnetic tunnel junction structure includes a reference layer, a non-magnetic layer, and a free layer. The reference layer includes a first side and a second side that is opposite the first side. The non-magnetic spacer includes a first side and a second side. The first side of the non-magnetic spacer is on the second side of the first reference layer. The free layer includes a first side and a second side. The first side of the free layer is on the second side of the non-magnetic spacer. The free layer further includes a first layer on the first side of the free layer, a second layer on the second side of the free layer and a coupling layer disposed between the first layer and the second layer. A saturation magnetization of the second layer is between 2-5 times inclusive a saturation magnetization of the first layer.

20 Claims, 7 Drawing Sheets

(51) Int. Cl.
*H01F 10/32* (2006.01)
*H10B 61/00* (2023.01)
*H10N 50/85* (2023.01)

(52) U.S. Cl.
CPC ............. *H10B 61/00* (2023.02); *H10B 61/22* (2023.02); *H10N 50/85* (2023.02)

(56) References Cited

U.S. PATENT DOCUMENTS

| | | | | |
|---|---|---|---|---|
| 9,028,910 | B2 | 5/2015 | Zhou et al. | |
| 9,437,268 | B2 | 9/2016 | Wang et al. | |
| 10,177,197 | B2 | 1/2019 | Apalkov et al. | |
| 10,396,278 | B2 | 8/2019 | Siddik et al. | |
| 10,516,103 | B1 | 12/2019 | Whig et al. | |
| 10,608,047 | B1 | 3/2020 | Gajek et al. | |
| 10,797,233 | B2 | 10/2020 | Gajek et al. | |
| 11,385,306 | B2 | 7/2022 | Mauri et al. | |
| 2010/0020592 | A1 | 1/2010 | Hosotani et al. | |
| 2012/0025339 | A1 | 2/2012 | Zhu | |
| 2012/0148735 | A1 | 6/2012 | Zhou | |
| 2012/0264234 | A1 | 10/2012 | Zhou et al. | |
| 2012/0295370 | A1 | 11/2012 | Zhou et al. | |
| 2013/0032910 | A1 | 2/2013 | Jung et al. | |
| 2013/0071954 | A1 | 3/2013 | Zhou et al. | |
| 2014/0248719 | A1 | 9/2014 | Zhou et al. | |
| 2016/0125924 | A1 | 5/2016 | Kita et al. | |
| 2017/0025472 | A1 | 1/2017 | Kim et al. | |
| 2017/0092848 | A1 | 3/2017 | Jang et al. | |
| 2018/0114898 | A1 | 4/2018 | Lee | |
| 2018/0261762 | A1 | 9/2018 | Apalkov et al. | |
| 2018/0309049 | A1 | 10/2018 | Chepulskyy et al. | |
| 2019/0207086 | A1 | 7/2019 | Kardasz et al. | |
| 2019/0319182 | A1 | 10/2019 | Duan et al. | |
| 2020/0006635 | A1 | 1/2020 | Rahman et al. | |
| 2020/0058802 | A1 | 2/2020 | Ito et al. | |
| 2020/0144482 | A1 | 5/2020 | Sonobe et al. | |
| 2020/0152699 | A1* | 5/2020 | Worledge | H10B 61/00 |
| 2020/0251650 | A1* | 8/2020 | Kim | H10N 50/10 |
| 2020/0303631 | A1 | 9/2020 | Gajek et al. | |
| 2021/0234092 | A1 | 7/2021 | Liu et al. | |
| 2021/0320245 | A1 | 10/2021 | Kalitsov et al. | |
| 2021/0367143 | A1 | 11/2021 | Lee et al. | |
| 2021/0384415 | A1 | 12/2021 | Sun | |
| 2022/0131071 | A1 | 4/2022 | Lill et al. | |
| 2022/0181061 | A1 | 6/2022 | Roiz-Wilson | |
| 2022/0238796 | A1 | 7/2022 | Sonobe et al. | |
| 2022/0285610 | A1 | 9/2022 | Zhao et al. | |
| 2022/0367099 | A1 | 11/2022 | Diao et al. | |
| 2023/0027792 | A1 | 1/2023 | Chiu et al. | |
| 2023/0298646 | A1* | 9/2023 | Wu | G11C 11/161 365/158 |
| 2025/0089266 | A1 | 3/2025 | Lee et al. | |

OTHER PUBLICATIONS

English translation of Eparkov (Year: 2017).
Office Action for U.S. Appl. No. 18/116,836, mailed Apr. 1, 2026.
Office Action for U.S. Appl. No. 18/116,839, mailed Jan. 23, 2026.
Translation of WO-2018224928-A 1 (Year: 2018).

* cited by examiner 800
804
803b
803c
$803a_2$
$803a_1$
802
$801b_2$
$801b_1$
801c
801a
803a
801b
803
801
$t_{FL2}$
$t_{FL1}$
FL2
FL1b
FL1a
RL2b
RL2a
CD 700
704
$703b_2$
$703b_3$
$703b_1$
703c
$703a_2$
$703a_3$
$703a_1$
702
701b
701c
701a
703b
703a
701
703
FL2b
FL2a
FL1b
FL1a 600
604
603b
603c
603a
602
601b
601c
601a
603
601
FL2
FL1

PERPENDICULAR SHAPE ANISOTROPY DESIGN WITH ASYMMETRIC COMPOSITE FREE LAYER

CROSS-REFERENCE TO RELATED APPLICATION

This application claims the priority benefit under 35 U.S.C. § 119(c) of U.S. Provisional Patent Application No. 63/437,359, filed on Jan. 5, 2023, the disclosure of which is incorporated herein by reference in its entirety. This application is also related to U.S. patent application Ser. No. 18/116,836, filed on Mar. 2, 2023, and U.S. patent application Ser. No. 18/116,839, filed on Mar. 2, 2023, both filed concurrently herewith, and the disclosure of both being incorporated herein by reference in their entireties.

TECHNICAL FIELD

The subject matter disclosed herein relates to magnetic tunnel junction devices. More particularly, the subject matter disclosed herein relates to magnetic tunnel junction bit structures having perpendicular shape anisotropy features.

BACKGROUND

Magnetic memories, particularly magnetic random access memories (MRAMs), have drawn increasing interest due to their potential for high read/write speed, excellent endurance, non-volatility and low power consumption during operation. An MRAM may store information utilizing magnetic materials as an information recording medium. One type of MRAM is a spin transfer torque random access memory (STT-MRAM). STT-MRAM utilizes magnetic junctions written at least in part by a current driven through the magnetic junction. A spin-polarized current driven through the magnetic junction exerts a spin torque on the magnetic moments in the magnetic junction. As a result, layer(s) having magnetic moments that are responsive to the spin torque may be switched to a desired state.

A conventional magnetic tunneling junction (MTJ) may be used in a conventional STT-MRAM. The conventional MTJ typically resides on a substrate. The conventional MTJ, uses conventional seed layer(s), may include capping layers and may include a conventional antiferromagnetic (AFM) layer. The conventional MTJ includes a conventional reference layer, a conventional free layer and a conventional tunneling barrier layer between the conventional pinned and free layers. A bottom contact below the conventional MTJ and a top contact on the conventional MTJ may be used to drive current through the conventional MTJ in a current-perpendicular-to-plane (CPP) direction.

The conventional reference layer and the conventional free layer are magnetic. The magnetization of the conventional reference layer is fixed, or pinned, in a particular direction. The conventional free layer has a changeable magnetization. The conventional free layer may be a single layer or include multiple layers.

To switch the magnetization of the conventional free layer, a current is driven perpendicular to plane. When a sufficient current is driven from the top contact to the bottom contact, the magnetization of the conventional free layer may switch to be parallel to the magnetization of a conventional bottom reference layer. When a sufficient current is driven from the bottom contact to the top contact, the magnetization of the free layer may switch to be antiparallel to that of the bottom reference layer. The differences in magnetic configurations correspond to different magnetoresistances and thus different logical states (e.g. a logical “0” and a logical “1”) of the conventional MTJ.

Because of their potential for use in a variety of applications, research in magnetic memories is ongoing. Mechanisms for improving the performance of MRAM are desired. For example, a lower switching current may be desired for easier and faster switching. Additionally, the magnetic moment of the free layer is desired to be thermally stable in the absence of a switching current being applied. Accordingly, what is needed is a method and system that may improve the switching and stability of the MRAM-based memories. The method and system described herein address such a need.

SUMMARY

An example embodiment provides a memory device that may include an MTJ structure having perpendicular shape anisotropy. The MTJ structure may include a reference layer, a non-magnetic spacer and a free layer. The reference layer may include a first side and a second side that is opposite the first side of the reference layer. The non-magnetic spacer may include a first side and a second side in which the first side of the non-magnetic spacer may be on the second side of the reference layer. The free layer may include a first side and a second side in which the first side of the free layer may be on the second side of the non-magnetic spacer. The free layer may further include a first layer on the first side of the free layer, a second layer on the second side of the free layer and a coupling layer disposed between the first layer and the second layer. A saturation magnetization $Ms_{FL2}$ of the second layer may be between 2 and 5 times inclusive a saturation magnetization $Ms_{FL1}$ of the first layer. In one embodiment, the first layer may be easier to switch magnetization directions than the second layer. In another embodiment, a ratio of thickness of the first layer to a thickness of the first layer and the second layer may be less than 0.5. In still another embodiment, a ratio of a thickness of the free layer to a critical dimension of the MTJ structure may be between 0.5 and 5.0 inclusive, and the critical dimension of the MTJ structure may range from 4-22 nm inclusive. In yet another embodiment, the first layer may include CoFeX or CoFeBX in which X may be a diluent element that includes vanadium (V), molybdenum (Mo), titanium (Ti), zirconium (Zr), hafnium (Hf), aluminum (Al), niobium (Nb), tantalum (Ta), chromium (Cr), rhodium (Rh) or bismuth (Bi), and in which the second layer may include CoFe or CoFeB. In one embodiment, the coupling layer may include a coupling of 0.5-3.0 erg/cm$^2$. In another embodiment, the non-magnetic spacer may include a metallic spacer, and one of the first layer or the second layer may include a Heusler material. In still another embodiment, the memory device may further include a spin-orbit torque line on the second side of the free layer in which the spin-orbit torque line may include alloys of two or more of tungsten (W), platinum (Pt), terbium (Tb), bismuth (Bi), selenium (Se), hafnium (Hf), zirconium (Zr), silver (Ag), gold (Au), and silicon (Si) materials.

An example embodiment provides a memory device that may include an MTJ structure having perpendicular shape anisotropy. The MTJ structure may include a reference layer, a non-magnetic spacer, and a free layer. The reference layer may include a first side and a second side that is opposite the first side of the reference layer. The non-magnetic spacer may include a first side and a second side in which the first side of the non-magnetic spacer may be on the second side of the reference layer. The free layer may include a first side and a second side in which the first side of the free layer may be on the second side of the non-magnetic spacer. The free layer may further include a first layer on the first side of the free layer, a second layer on the second side of the free layer and a coupling layer disposed between the first layer and the second layer. A ratio of thickness of the first layer to a thickness of the first layer and the second layer may be less than 0.5. In one embodiment, the first layer may be easier to switch magnetization directions than the second layer. In another embodiment, a saturation magnetization $Ms_{FL2}$ of the second layer may be between 2 and 5 times a saturation magnetization $Ms_{FL1}$ of the first layer. In still another embodiment, a ratio of a thickness of the free layer to a critical dimension of the MTJ structure may be between 0.5 and 5.0 inclusive, and the critical dimension of the MTJ structure may range from 4-22 nm inclusive. In yet another embodiment, the first layer may include CoFeX or CoFeBX in which X is a diluent element that may include vanadium (V), molybdenum (Mo), titanium (Ti), zirconium (Zr), hafnium (Hf), aluminum (Al), niobium (Nb), tantalum (Ta), chromium (Cr), rhodium (Rh) or bismuth (Bi), and in which the second layer may include CoFe or CoFeB. In one embodiment, the coupling layer may include a coupling of 0.5-3.0 erg/$cm^2$. In another embodiment, the non-magnetic spacer may include a metallic spacer, and one of the first layer or the second layer may include a Heusler material. In still another embodiment, the memory device may include a spin-orbit torque line on the second side of the free layer in which the spin-orbit torque line may include alloys of two or more of tungsten (W), platinum (Pt), terbium (Tb), bismuth (Bi), hafnium (Hf), selenium (Se), zirconium (Zr), silver (Ag), gold (Au), and silicon (Si) materials.

An example embodiment provides a memory device that may include an MTJ structure having perpendicular shape anisotropy. The MTJ structure may include a reference layer, a non-magnetic spacer, and a free layer. The reference layer may include a first side and a second side that is opposite the first side of the reference layer. The non-magnetic spacer may include a first side and a second side in which the first side of the non-magnetic spacer may be on the second side of the reference layer and in which the non-magnetic spacer may include a metallic spacer. The free layer may include a first side and a second side in which the first side of the free layer may be on the second side of the non-magnetic spacer. The free layer may further include a first layer on the first side of the free layer, a second layer on the second side of the free layer and a coupling layer disposed between the first layer and the second layer. One of the first layer or the second layer may include a Heusler material. A saturation magnetization $Ms_{FL2}$ of the second layer may be between 2 and 5 times inclusive of a saturation magnetization $Ms_{FL1}$ of the first layer. In one embodiment, the coupling layer may include a coupling of 0.5-3.0 erg/$cm^2$ inclusive. In another embodiment, the first layer may be easier to switch magnetization directions than the second layer, a ratio of a thickness of the free layer to a critical dimension of the MTJ structure may be between 0.5 and 5.0 inclusive, and the critical dimension of the MTJ structure may range from 4-22 nm. In still another embodiment, the memory device may include a capping layer on the second side of the free layer that may include one or more of magnesium oxide (MgO), tantalum oxide (TaO), niobium oxide (NiO), iridium oxide (IrO), sodium oxide (NaO), rhodium oxide (RhO), or osmium oxide (OsO).

BRIEF DESCRIPTION OF THE DRAWING

In the following section, the aspects of the subject matter disclosed herein will be described with reference to exemplary embodiments illustrated in the figure, in which.

DETAILED DESCRIPTION

Figure 2:
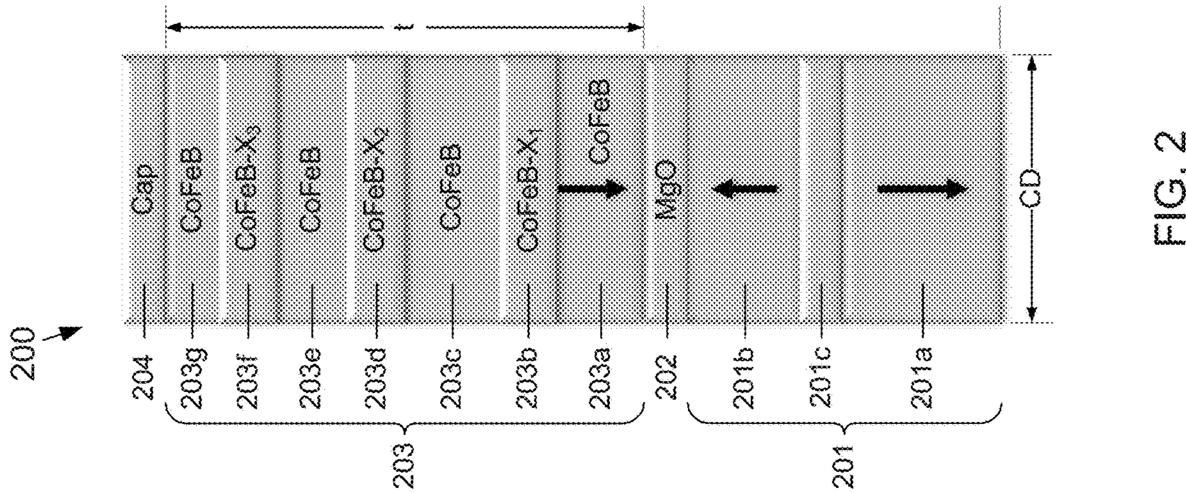
FIG. 2 depicts a second example embodiment of an MTJ bit structure having perpendicular shape anisotropy with a free layer having a reduced $A_{ex}$ according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock." "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising." when used in this specification, specify the presence of stated features, integers, steps, operations, elements, and/or components, but do not preclude the presence or addition of one or more other features, integers, steps, operations, elements, components, and/or groups thereof. The terms "first," "second." etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware." as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

Exemplary embodiments disclosed herein relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The exemplary embodiments may also be used in other magnetic devices not configured for use as a magnetic memory. The following description is presented to enable one of ordinary skill in the art to make and use the invention and is provided in the context of a patent application and its requirements. Various modifications to the exemplary embodiments and the generic principles and features described herein will be readily apparent. The exemplary embodiments disclosed herein are mainly described in terms of particular methods and systems provided in particular implementations. The methods and systems, however, will operate effectively in other implementations. Phrases such as "exemplary embodiment," "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. The method and system, however, operate effectively for other methods having different and/or additional steps and steps in different orders that are not inconsistent with the exemplary embodiments. Thus, the subject matter disclosed herein is not intended to be limited to the embodiments shown, but is to be accorded the widest scope consistent with the principles and features described herein.

A bit structure for a magnetic junction is described herein. The magnetic junction includes a reference layer, a non-magnetic spacer layer and a free layer. The free layer is switchable between stable magnetic states using a current passed through the magnetic junction. The non-magnetic spacer layer is between the free layer and the reference layer. The free layer may include a soft magnetic layer, a hard magnetic layer and/or an oxide coupling layer between the hard magnetic layer and the soft magnetic layer. The soft magnetic layer may have a soft layer magnetic thermal stability coefficient of not more than 30. The hard magnetic layer may have a hard layer magnetic thermal stability coefficient of at least twice the soft layer magnetic thermal stability coefficient.

The exemplary embodiments disclosed herein are described in the context of particular methods, magnetic junctions and/or magnetic memories having certain components. One of ordinary skill in the art will readily recognize that the exemplary embodiments are consistent with the use of magnetic junctions and magnetic memories having other and/or additional components and/or other features not inconsistent with the embodiments disclosed herein. Methods and/or systems may also be described in the context of current understanding of the spin transfer phenomenon, of magnetic anisotropy, and other physical phenomenon. Consequently, one of ordinary skill in the art will readily recognize that theoretical explanations of the behavior of any method and/or system disclosed herein are made based upon this current understanding of spin transfer, magnetic anisotropy and other physical phenomena. Any methods and/or systems described herein, however, are not dependent upon a particular physical explanation. One of ordinary skill in the art will also readily recognize that any methods and/or systems described herein are described in the context of a structure having a particular relationship to the substrate. One of ordinary skill in the art, however, will readily recognize that any methods and/or systems described herein are consistent with other structures. Additionally, any methods and/or systems are described herein are described in the context of certain layers being synthetic and/or simple. One of ordinary skill in the art, however, will readily recognize that the layers could have another structure. Furthermore, any methods and/or systems described herein are described in the context of magnetic junctions and/or substructures having particular layers. One of ordinary skill in the art, however, will readily recognize that magnetic junctions and/or substructures having additional and/or different layers not inconsistent with any method and/or system described herein could also be used.

Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. Any methods and/or systems described herein may also be described in the context of certain alloys. Unless otherwise specified, if specific concentrations of the alloy are not mentioned, any stoichiometry not inconsistent with any method and/or system described herein may be used. The magnetic junctions are also described in the context of layers having particular thicknesses and depicted as continuous layers having a constant thickness. One of ordinary skill in the art will understand that particularly for very thin layers, one or more layer(s) of the magnetic junction may have a thickness that varies across the magnetic junction and/or may be discontinuous. Additionally, one of skill in the art will recognize when the terms "region" and "layer" are being used interchangeably.

Perpendicular Shape Anisotropy (PSA) Design with Reduced $A_{ex}$

A first type of MTJ bit structure disclosed herein includes a PSA structure with a reduced $A_{ex}$, where $A_{ex}$ refers to an exchange stiffness constant that characterizes exchange coupling strength between neighboring magnetic moments in a magnetic material. As used herein, the term "perpendicular shape anisotropy" is used to describe the magnetic anisotropy of an MTJ in which the direction of easy magnetic axes is perpendicular to the layer (or film) surface. The first through the fourth example embodiments (FIGS. 1-4) disclosed herein are of this first type of MTJ bit structures. The free layer or region for a first type MTJ has a reduced $A_{ex}$ of about 0.5 μerg/cm that provides an increase in the Figure of Merit (FOM) (defined as the ratio of the thermal stability to the critical current ($\Delta/I_{c0}$)) of up to 2× over the FOM of a conventional MTJ having a PSA configuration. The FOM for a first type of MTJ bit structure may be greater than 3. The reduced $A_{ex}$, which may be achieved by adding dilution elements in the free layer, may also provide a high saturation magnetization Ms so that a high energy barrier $E_b$ is maintained at small critical dimensions (CDs). It should be noted that $E_b$ is largely insensitive to $A_{ex}$ unless a very high aspect ratio (AR) (i.e., free layer thickness/CD (t/CD)) is used. In example embodiments, MTJs of the first type MTJs disclosed herein may have a CD of between about 3 and 20 nm inclusive, and may have an AR of between 0.5 and 5.0 inclusive.

Figure 1:
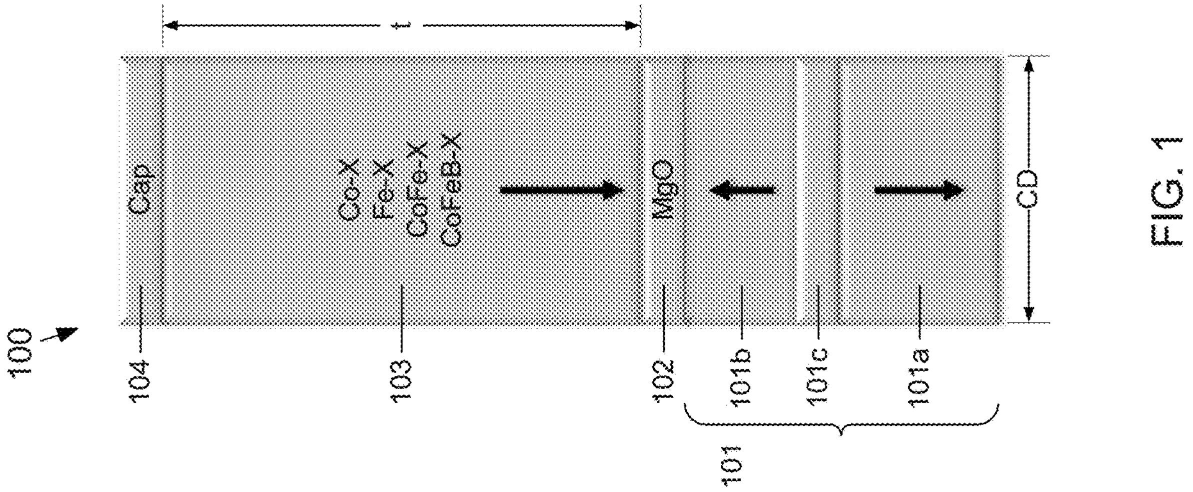
FIG. 1 depicts a first example embodiment of an MTJ bit structure having perpendicular shape anisotropy with a free layer having a reduced $A_{ex}$ according to the subject matter disclosed herein.

FIG. 1 depicts a first example embodiment of an MTJ bit structure 100 having PSA with a free layer having a reduced $A_{ex}$ according to the subject matter disclosed herein. The MTJ 100 may include a reference magnetic region 101, a tunnel barrier region 102, a free magnetic region 103, and a capping region 104. The MTJ 100 may be formed on a substrate (not shown) that may include other components and/or connections (also not shown).

The reference magnetic region 101 may include at least two magnetic regions 101*a* and 101*b* that are separated by a coupling region 101*c*. In one embodiment, the magnetic region 101*a* may be formed on a substrate (not shown), and the coupling region 101*c* may be formed on the magnetic region 101*a* opposite from the substrate. The magnetic region 101*b* may be formed on the coupling region 101*c* opposite from the magnetic region 101*a*. Together the magnetic regions 101*a* and 101*b* and the coupling region 101*c* form a synthetic antiferromagnetic (SAF) region. The magnetic directions of the magnetic regions 101*a* and 101*b* are depicted in FIG. 1 by arrows within the regions 101*a* and 101*b*. The magnetic regions 101*a* and 101*b* may be referred to as being anti-parallel based on the two different direction of the arrows in the magnetic regions 101*a* and 101*b*.

The magnetic regions 101*a* and 101*b* may be formed from one or more of ferromagnetic elements nickel (Ni), iron (Fe), and/or cobalt (Co), including alloys or engineered materials with one or more of the elements palladium (Pd), platinum (Pt), nickel (Ni), and alloys thereof. The coupling region 101*c* may be an antiferromagnetic (AF) coupling region that includes non-ferromagnetic materials such as, for example, iridium (Ir), ruthenium (Ru), rhenium (Re), rhodium (Rh) or alloys thereof. The thickness of the non-ferromagnetic material(s) may range from 0.4 nm to 2.0 nm inclusive.

The tunnel barrier region 102 of the MTJ 100 may be formed on the magnetic region 101*b* opposite from the coupling region 101*c*. The tunnel barrier region 102 may be formed from an oxide, such as magnesium oxide (MgO). Alternatively, the tunnel barrier region 102 may be formed from Al—O, Mg—Al—O, Ti—O, Zr—O, Sc—O, Sr—O or a combination of oxides. The thickness for the tunnel barrier region 102 may be between 0.3 nm and 2.5 nm inclusive. In an alternative embodiment, the tunnel barrier region 102 may be replaced by a conducting spacer layer, such as Cu, Ge, Ag, or other similar elements or combinations (including alloys and multilayers). For the conducting spacer layer, thicknesses may be increased to a range from 0.3 nm to 200 nm inclusive.

The free magnetic region 103 may be formed on the tunnel barrier region 102 opposite from the magnetic region 101*b*. The free magnetic region 103 of the MTJ 100 may include one or more dilution elements that maintains Ms of the free magnetic region 103 while reducing $A_{ex}$. In one embodiment, the free magnetic region 103 may be formed from Fe—X, Co—X, CoFe—X and CoFeB—X in which X is a diluent element, such as fluorine (F), strontium (Sr), nickel (Ni), rubidium (Rb), potassium (K), helium (He), platinum (Pt), iridium (Ir), manganese (Mn), ruthenium (Ru), beryllium (Be), niobium (Nb), tungsten (W), and/or molybdenum (Mo). The thickness of the free magnetic region 103 depends on the in-plane CD, and may be from 0.5*CD to 5.0*CD inclusive. In one example embodiment, the MTJ 100 may have a CD of between about 3 and 20 nm inclusive, and may have an AR of between 0.5 and 5.0 inclusive. The arrow depicted within the free magnetic region 103 indicates a magnetization direction for the free magnetic region that places the MTJ 100 in a high-resistance state (RH) (antiparallel to the near magnetic region 101*b* or the SAF/reference magnetic region 101). When the magnetization direction of the free magnetic region 103 is in the opposite direction, the MTJ 100 is in a low-resistance state ($R_L$) (parallel to the near magnetic region 101*b* or the SAF/reference magnetic region 101). The other example embodiments disclosed herein similarly exhibit high- and low-resistance states based on the magnetization direction of the free magnetic region with respect to the reference magnetic region 101.

The capping region 104 may be formed on the free magnetic region 103 opposite from the tunnel barrier region 102. The capping region 104 may be a perpendicular magnetic anisotropy (PMA) controlling (i.e., increasing PMA) layer, such as one or more of magnesium oxide (MgO), tantalum oxide (TaO), nickel oxide (NiO), niobium oxide (NbO), iridium oxide (IrO), sodium oxide (NaO), rhodium oxide (RhO), or osmium oxide (OsO). The thickness of the capping region 104 may be from 0.3 nm to 2.5 nm inclusive. As the oxide capping region 104 can reduce TMR by serial parasitic resistance, the capping region 104 may be shunted on purpose by the process of forming the MTJ.

FIG. 2 depicts a second example embodiment of an MTJ bit structure 200 having PSA with a free layer having a reduced $A_{ex}$ according to the subject matter disclosed herein. The MTJ 200 may be considered be a variation of the MTJ 100 by having a free magnetic region formed from multiple layers. Similar to the MTJ 100, the MTJ 200 includes a free layer having a reduced $A_{ex}$ of about 0.5 μerg/cm. Additionally, the MTJ 200 has an increase in the FOM of up to 2× over the FOM of a conventional MTJ having a PSA configuration. The reduced $A_{ex}$, which may be achieved by adding dilution elements in the free layer, may also provide a high saturation magnetization Ms so that a high energy barrier $E_b$ is maintained at small CDs. Other similarities include that the MTJ 200 may have a CD of between about 3 nm to 20 nm inclusive, and may have an AR (ratio of free layer thickness t to CD) ranging from 0.5 and 5.0 inclusive.

The MTJ 200 may include a reference magnetic region 201, a tunnel barrier region 202, a free magnetic region 203, and a capping region 204. The MTJ 200 may be formed on a substrate (not shown) that may include other components and/or connections (also not shown).

The reference magnetic region 201 may include at least two magnetic regions 201*a* and 201*b* that are separated by a coupling region 201*c* that together form an SAF region. In one embodiment, the magnetic region 201*a* may be formed on a substrate (not shown), and the coupling region 201*c* may be formed on the magnetic region 201*a* opposite from the substrate. The magnetic region 201*b* may be formed on the coupling region 201*c* opposite from the magnetic region 201*a*. The anti-parallel magnetic directions of the magnetic regions 201*a* and 201*b* are indicated by arrows within the regions 201*a* and 201*b*. The regions 201*a* and 201*b* may be formed from one or more of ferromagnetic elements Ni, Fe and Co, including alloys or engineered materials with one or more of the elements Pd, Pt. Ni, and alloys thereof. The coupling region 201*c* may be an antiferromagnetic coupling region that includes non-ferromagnetic materials such as, for example, Ir, Ru, Re, Rh or alloys thereof. The thickness of the non-ferromagnetic material(s) may range from 0.4 nm to 2.0 nm inclusive.

The tunnel barrier region 202 may be formed on the magnetic region 201*b* opposite from the coupling region 201*c*. The tunnel barrier region 202 may be formed from an oxide, such as MgO. Alternatively, the tunnel barrier region 202 may be formed from Al—O, Mg—Al—O,)—O, Zr—O, Sc—O, Sr—O or a combination of oxides. The thickness of the tunnel barrier region 202 may range from 0.3 nm to 2.5 nm inclusive. In an alternative embodiment, the tunnel barrier region 202 may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The free magnetic region 203 may be formed on the tunnel barrier region 202 opposite from the magnetic region 201*b*. The free magnetic region 203 may include multiple layers comprising sublayers having no dilution elements alternating with sublayers having dilution elements. Together the multiple sublayers operate so that the free magnetic region 203 maintains Ms while reducing $A_{ex}$. As depicted in the example embodiment of FIG. 2, the sublayers 203*a*, 203*c*, 203*c* and 203*g* may be non-dilution sublayers that may be formed from, for example, Fc, Co. CoFe and/or CoFeB. Each respective non-dilution sublayer may be formed from the same or from a different non-dilution material as other non-dilution sublayers. Dilution sublayers 203*b*, 203*d* and 203*f* may be formed from materials, such as Fe—X, Co—X, CoFe—X and CoFeB—X, in which X is a diluent element, such as F, Sr, Ni, Rb, K, He, Pt, Ir, Mn, Ru, Be, Nb, W, and/or Mo. The subscript for X shown in FIG. 2 indicates that each respective dilution sublayer may be formed to include the same or different diluent elements as other dilution sublayers. The thickness ratio of diluent portion may vary from 10% to 80% inclusive of the total thickness of the free magnetic region 203. It should be understood that a free magnetic region 203 may have a different number of multiple layers than the seven layers depicted in FIG. 2.

The capping region 204 may be formed on the free magnetic region 203 opposite from the tunnel barrier region 202. The capping region 204 may be a PMA-controlling (i.e., increasing PMA) layer, such as one or more of MgO, TaO, NiO, NbO, IrO, NaO, RhO, or OsO. The thickness of the capping region 204 may range from 0.3 nm to 2.5 nm inclusive. As the oxide capping region 204 can reduce TMR by serial parasitic resistance, the capping region 204 may be shunted on purpose by the process of forming the MTJ.

Figure 3:
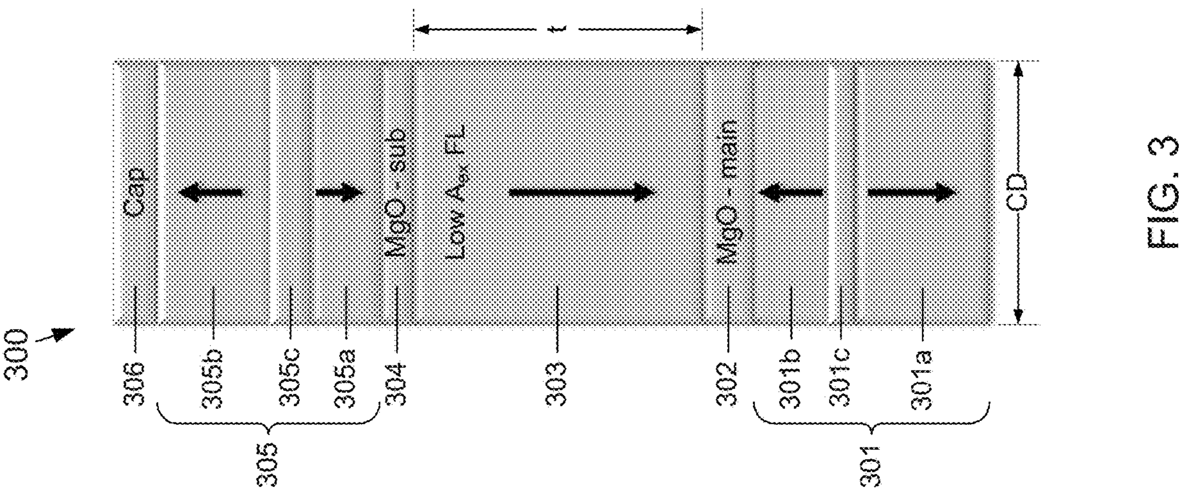
FIG. 3 depicts a third example embodiment of an MTJ bit structure having perpendicular shape anisotropy with a free layer having a reduced $A_{ex}$ according to the subject matter disclosed herein.

FIG. 3 depicts a third example embodiment of an MTJ bit structure 300 having PSA with a free layer having a reduced $A_{ex}$ according to the subject matter disclosed herein. The MTJ 300 includes two separate reference layers that form a dual MTJ design for doubling of the spin transfer torque (STT). Similar to the MTJ 100, the MTJ 300 also includes a free layer having a reduced $A_{ex}$ of about 0.5 μerg/cm and provides an increase in the FOM of up to 2× over the FOM of a conventional MTJ having a PSA configuration. The reduced $A_{ex}$ may provide a high saturation magnetization Ms so that a high energy barrier $E_b$ is maintained at small CDs. The MTJ 300 may have a CD of that ranges from 3 nm to 20 nm inclusive, and may have an AR ranging from 0.5 and 5.0 inclusive.

The MTJ 300 may include a first reference magnetic region 301, a first tunnel barrier region 302, a free magnetic region 303, a secondary barrier region 304, a second reference magnetic region 305, and a capping region 306. The free magnetic region 303 may be formed between the first and second reference magnetic regions 301 and 305. The MTJ 300 may be formed on a substrate (not shown) that may include other components and/or connections (also not shown).

The first reference magnetic region 301 may include at least two magnetic regions 301*a* and 301*b* that are separated by a coupling region 301*c*. In one embodiment, the magnetic region 301*a* may be formed on a substrate (not shown). The coupling region 301*c* may be formed on the magnetic region 301*a* opposite from the substrate. The magnetic region 301*b* may be formed on the coupling region 301*c* opposite from the magnetic region 301*a*. Together the magnetic regions 301*a* and 301*b* and the coupling region 301*c* form an SAF region. The anti-parallel magnetic directions of the magnetic regions 301*a* and 301*b* are indicated by arrows within the regions 301*a* and 301*b*. The regions 301*a* and 301*b* may be formed from one or more of ferromagnetic elements Ni, Fe, and Co, including alloys or engineered materials with one or more of the elements Pd, Pt, Ni, and alloys thereof. The coupling region 301*c* may be an antiferromagnetic coupling region that includes non-ferromagnetic materials such as, for example, Ir, Ru, Re, Rh or alloys thereof. The thickness of the non-ferromagnetic material(s) may range from 0.4 nm to 2.0 nm inclusive.

The (main) tunnel barrier region 302 may be formed from an oxide, such as MgO. Alternatively, the tunnel barrier region 302 may be formed from Al—O, Mg—Al—O, Ti—O, Zr—O, Sc—O. Sr—O or a combination of oxides. The thickness for the tunnel barrier region 302 may range from 0.3 nm and 2.5 nm inclusive. In an alternative embodiment, the tunnel barrier region 302 may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The free magnetic region 303 may be formed on the tunnel barrier region 302 opposite from the magnetic region 301*b*. The free magnetic region 303 of the MTJ 300 may include one or more dilution elements that maintain Ms of the free magnetic region 303 while reducing $A_{ex}$. In one embodiment, the free magnetic region 303 may include Fe—X, Co—X, CoFe—X and CoFeB—X in which X is a diluent element, such as F, Sr, Ni, Rb, K, He, Pt, Ir, Mn, Ru, Be, Nb, W, and/or Mo. The thickness of the free magnetic region 303 depends on the in-plane CD, which may vary from 0.5*CD to 5.0*CD inclusive.

The secondary barrier region 304 may be formed on the free magnetic region 303 opposite from the main barrier region 302. The secondary barrier region 304 may be formed from an oxide, such as MgO and/or aluminum oxide ($Al_2O_3$). Alternatively, the secondary barrier region 304 may be formed from Al—O, Mg—Al—O, Ti—O, Zr—O, Sc—O, Sr—O or a combination of oxides. The thickness of the secondary barrier region 304 may range from 0.3 nm and 2.5 nm inclusive. In an alternative embodiment, the secondary barrier region 304 may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive. Alternatively, the second barrier region 304 may be formed from a metal spin-valve (SV) type spacer that provides polarization.

The second reference magnetic region 305 may be formed on the secondary barrier region 304 opposite from the free magnetic region 303. The second reference magnetic region 305 may include at least two reference magnetic regions 305*a* and 305*b* that are separated by a coupling region 305*c*. In one embodiment, the magnetic region 305*a* may be formed on the secondary barrier region 304. The coupling region 305*c* may be formed on the magnetic region 305*a* opposite from the secondary barrier region 304. The magnetic region 305*b* may be formed on the secondary barrier region 305*c* opposite from the magnetic region 305*a*. Together the reference magnetic regions 305*a* and 305*b* and the coupling region 305*c* form an SAF region. The anti-parallel magnetic directions of the magnetic regions 305*a* and 305*b* are indicated by arrows within the regions 305*a* and 305*b*. The regions 305*a* and 305*b* may be formed from one or more of ferromagnetic elements Ni, Fe, and Co, including alloys or engineered materials with one or more of the elements Pd. Pt. Ni, and alloys thereof. The coupling region 305*c* may be an antiferromagnetic coupling region that includes non-ferromagnetic materials such as, for example, Ir, Ru, Re, Rh or alloys thereof. The thickness of the non-ferromagnetic material(s) may range from 0.4 nm to 2.0 nm inclusive.

The capping region 306 may be formed on the second reference magnetic region 305 opposite from the secondary barrier region 304. The capping region 306 may be a PMA-controlling (i.e., increasing PMA) layer, such as one or more of MgO, TaO, NiO, NbO, IrO, NaO, RhO, or OsO. The thickness of the capping region 306 may range from 0.3 nm to 2.5 nm inclusive. As the oxide capping region 306 can reduce TMR by serial parasitic resistance, the capping region 306 may be shunted on purpose by the process of forming the MTJ.

Figure 4:
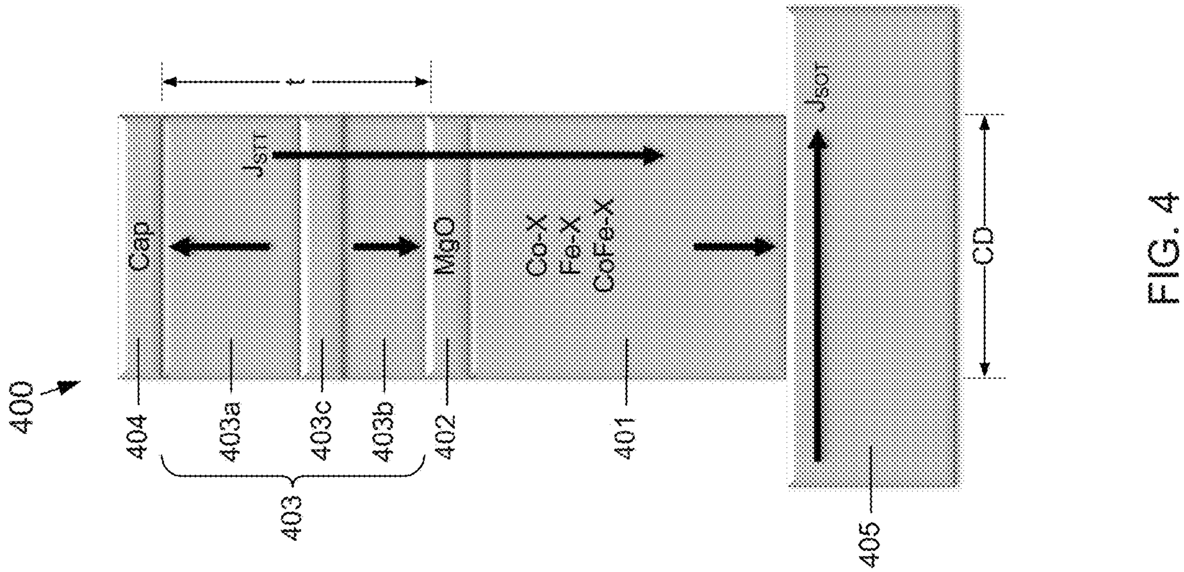
FIG. 4 depicts a fourth example embodiment of an MTJ bit structure having perpendicular shape anisotropy with a free layer with reduced $A_{ex}$ and configured for spin-orbit torque and spin transfer torque switching according to the subject matter disclosed herein.

FIG. 4 depicts a fourth example embodiment of an MTJ bit structure 400 having PSA with a free layer with reduced $A_{ex}$ and configured for spin-orbit torque (SOT) and spin transfer torque (STT) switching according to the subject matter disclosed herein. The MTJ 400 includes a free layer having a reduced $A_{ex}$ of about 0.5 μerg/cm that provides an increase in FOM of up to 2× over the FOM of a conventional MTJ having a PSA configuration. The reduced $A_{ex}$ may provide a high saturation magnetization Ms so that a high energy barrier $E_b$ is maintained at small CDs. The MTJ 400 may have a CD of between about 3 nm to 20 nm inclusive, and may have an AR of between 0.5 and 5.0 inclusive.

The MTJ 400 may include a free magnetic region 401, a tunnel barrier layer 402, a reference magnetic region 403, and a capping region 404 that are all formed on an SOT line 405. In one embodiment, the free magnetic region 401 may be formed on the SOT line 405, and may include Fe—X, Co—X, CoFe—X and CoFeB—X in which X is a diluent element, such as F, Sr, Ni, Rb, K, He, Pt, Ir, Mn, Ru, Be, Nb, W, and/or Mo. The thickness of the free magnetic region 401 depends on the in-plane CD, which may vary from 0.5*CD to 5.0*CD inclusive.

The tunnel barrier region 402 may be formed on the free magnetic region 401. The tunnel barrier region 402 may be formed from an oxide, such as MgO. Alternatively, the tunnel barrier region 402 may be formed from Al—O, Mg—Al—O, Ti—O, Zr—O, Sc—O, Sr—O or a combination of oxides. The thickness of the tunnel barrier region 402 may range from 0.3 nm to 2.5 nm inclusive. In an alternative embodiment, the tunnel barrier region 402 may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The reference magnetic region 403 may include at least two magnetic regions **403*a* and 403*b* that are separated by a coupling region 403*c*. The magnetic region 403*a* may be formed on the tunnel barrier region 402 opposite from the free magnetic region 401. The coupling region 403*c* may be formed on the magnetic region 403*a* opposite from the tunnel barrier region 402. The magnetic region 403*b* may be formed on the coupling region 403*c* opposite from the magnetic region 403*a*. Together the magnetic regions 403*a* and 403*b*, and the coupling region 403*c* form an SAF region. The anti-parallel magnetic directions of the magnetic regions 403*a* and 403*b* are indicated by arrows within the regions 403*a* and 403*b*. The regions 403*a* and 403*b* may be formed from one or more of ferromagnetic elements Ni, Fe, and/or Co, including alloys or engineered materials with one or more of the elements Pd, Pt, Ni and alloys thereof. The coupling region 403*c*** may be an antiferromagnetic coupling region that includes non-ferromagnetic materials such as, for example, Ir, Ru, Re, Rh or alloys thereof. The thickness of the non-ferromagnetic material(s) may range from 0.4 nm to 2.0 nm inclusive.

The capping region 404 may be formed on the magnetic region **403*b* opposite from the coupling region 403*c*. The capping region 406 may be a PMA-controlling (i.e., increasing PMA) layer, such as one or more of MgO, TaO, NiO, NbO, IrO, NaO, RhO, or OsO. The thickness of the capping region 404 may range from 0.3 nm to 2.5 nm inclusive. As the oxide capping region 404 can reduce TMR by serial parasitic resistance, the capping region 404 may be shunted on purpose by the process of forming the MTJ An SOT line 405 may include alloys of two or more materials of tungsten (W), platinum (Pt), terbium (Tb), bismuth (Bi), selenium (Se), hafnium (Hf), zirconium (Zr), silver (Ag), gold (Au), or silicon (Si) materials (e.g., W—Hf). These materials may include some oxidation at the interface between the SOT line 405 and the free magnetic region 401. Additionally, the materials used for the SOT line 405** may include multilayers (e.g., Au/Si). Topological insulators may be used, such as BiTe, BiSe, TlBiTe, TlBiSe, SbTeS, BiTeS, BiTeSe, GeSbTe, SnSbTe, GeBiTe, SnBiTe, BiSb or BiSbSe. The directions of the current densities for spin-orbit torque $J_{SOT}$ and spin torque transfer $J_{STT}$ are each indicated by an arrow.

Perpendicular Shape Anisotropy (PSA) Design with Dual Spin Filtering (DSF Structure)

A second type of MTJ bit structure disclosed herein includes a modified PSA structure and Dual Spin Filtering (DSF). The fifth through the eight example embodiments (FIGS. 5-8) disclosed herein are of this second type of MTJ bit structures. The second type of MTJ bit structures may include a non-shunted tunnel barrier (TB) or a non-shunted spin valve (SV) that provides a spin torque transfer in which a secondary tunnel barrier (also non-shunted) also provides an STT. In one embodiment, the secondary TB may be a metallic layer that provides spin polarization. Interfacial PMA generation from the secondary TB may be optional, and the secondary TB may provide a weak coupling. MTJ structures of the second type also include a reduced switching current by up to 2× while maintaining same $E_b$ by using one or more insertion layers that provide spin polarization. A free magnetic region of a second type MTJ includes a relatively softer free layer that has a relatively smaller Ms or is a thinner layer. Coupling across an insertion layer for a second type MTJ may be weak (i.e., $J_{ex}$<0.5 erg/cm$^2$). The second type MTJ structures exhibit two-stage switching because coupling across an insertion layer in the free layer may be weak. Additionally, a second type MTJ bit structure may have a CD that ranges from 4 nm to 22 nm inclusive, and may have an AR for the entire free magnetic layer (free magnetic region) stack $((t_{FL1}+t_{FL2})/CD)$ of between 0.5 and 5.0 inclusive.

Figures 5, 5A, 5B:
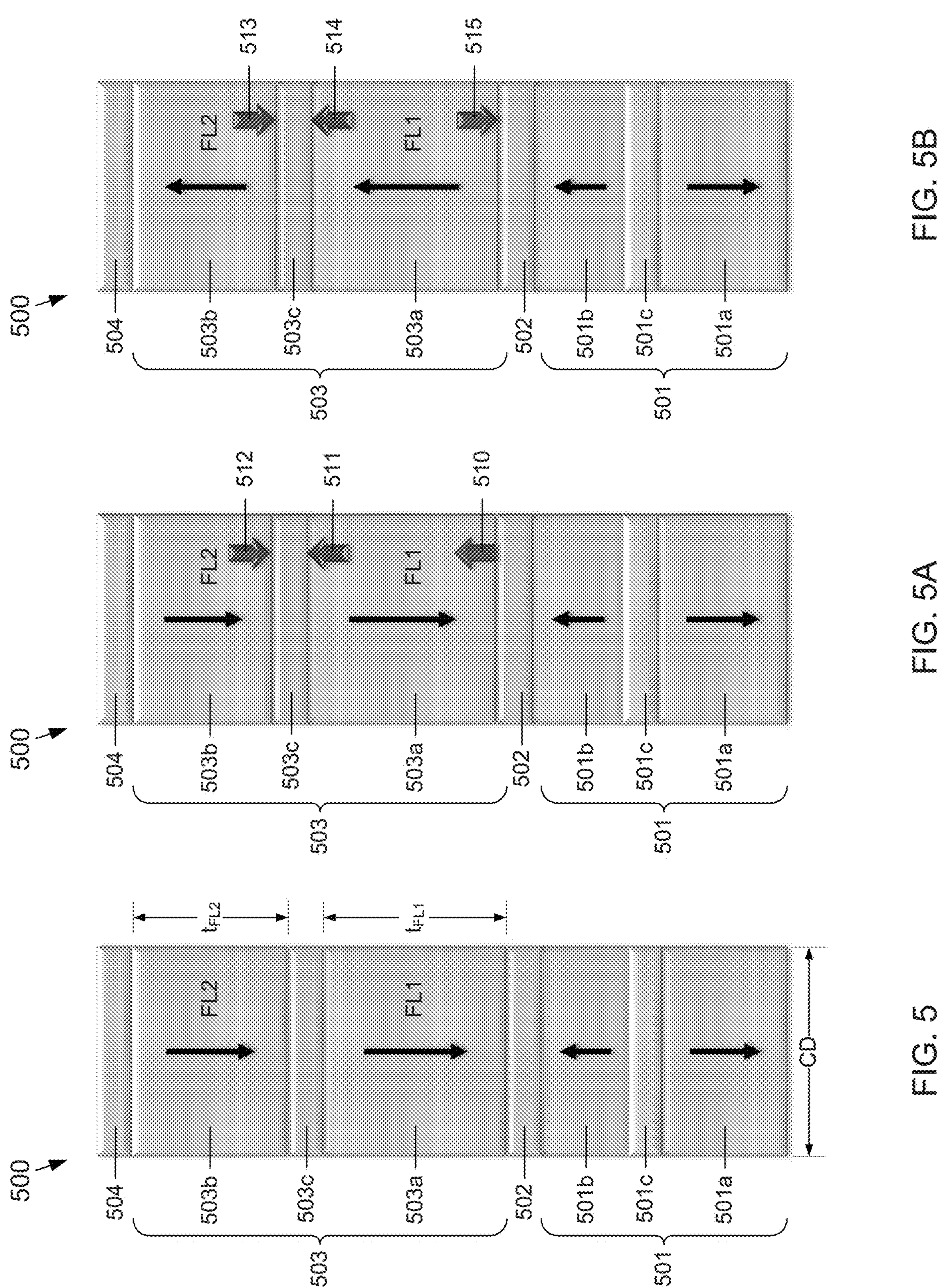
FIG. 5 depicts a fifth example embodiment of an MTJ bit structure having perpendicular shape anisotropy with dual spin filtering according to the subject matter disclosed herein.
FIG. 5A depicts how anti-parallel-to-parallel (AP→P) switching occurs in the MTJ of FIG. 5.
FIG. 5B depicts how parallel-to-anti-parallel (P→AP) switching occurs in the MTJ of FIG. 5.

FIG. 5 depicts a fifth example embodiment of an MTJ bit structure 500 having PSA with DSF according to the subject matter disclosed herein. The free magnetic region of the MTJ 500 may include two layers that are configured to be asymmetric in that one of the free layers is "softer" than the other free layer (i.e., easier to switch than the first free layer) by having a lower saturation magnetization Ms, either by using diluent elements or by one of the layers being thinner than the other. The MTJ 500 provides an increase in the FOM of up to 2× over a conventional MTJ having a PSA configuration.

The MTJ 500 may include a reference magnetic region 501, a main barrier region 502, a free magnetic region 503, and a capping region 504. The MTJ 500 may be formed on a substrate (not shown) that may include other components and/or connections (also not shown).

The reference magnetic region 501 may include at least two magnetic regions **501*a* and 501*b* that are separated by a coupling region 501*c*. The magnetic region 501*a* may be formed on a substrate (not shown). The coupling region 501*c* may be formed on the magnetic region 501*a* opposite from the substrate. The magnetic region 501*b* may be formed on the coupling region 501*c* opposite from the magnetic region 501*a*. Together the magnetic regions 501*a* and 501*b*, and the coupling region 501*c* form an SAF region. The anti-parallel magnetic directions of the magnetic regions 501*a* and 501*b* are indicated by arrows within the regions 501*a* and 501*b*. The regions 501*a* and 501*b* may be formed from one or more of ferromagnetic elements Ni, Fe, and/or Co, including alloys or engineered materials with one or more of the elements Pd, Pt, Ni and alloys thereof. The coupling region 501*c*** may be an AF coupling region that includes non-ferromagnetic materials, such as Ir, Ru, Re, Rh or alloys thereof. The thickness of the non-ferromagnetic material(s) may range from 0.4 nm to 2.0 nm inclusive.

The main barrier region 502 may be formed on the magnetic region 501*b* opposite from the coupling region 501*c*. The main barrier region 502 may be formed from an oxide, such as MgO. Alternatively, the main barrier region 502 may be formed from Al—O, Mg—Al—O, Ti—O. Zr—O, Sc—O, Sr—O or a combination of oxides. The thickness of the main barrier region 502 may range from 0.3 nm to 2.5 nm inclusive. In an alternative embodiment, the main barrier region 502 may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The free magnetic region 503 may be formed from a first free sublayer (FL1) 503*a*, a second free sublayer (FL2) 503*b*, and a secondary tunnel barrier 503*c*. The first free sublayer 503*a* may be formed on the main barrier region 502 opposite the magnetic region 501*b*. The secondary tunnel barrier 503*c* may be formed on the first free sublayer 503*a* opposite from the main barrier region 502. The second free sublayer 503*b* may be formed on the secondary tunnel barrier 503*c* opposite from the first free sublayer 503*a*. The thickness of the first free sublayer may be approximately equal to a thickness of a second free sublayer (i.e., $t_{FL1} \approx t_{FL2}$). In one embodiment, a ratio of $t_{FL1}/t_{FL2}$ may range from 0.8 to 1.2 inclusive. The saturation magnetization $Ms_{FL2}$ may be approximately half of the $Ms_{FL1}$ so that the second free sublayer 503*b* is easier to switch than the first free sublayer 503*a*, which difference may be due to dilution of the second free sublayer 503*b*, as discussed below. In one embodiment, a ratio of $Ms_{FL2}/Ms_{FL1}$ may range from 0.4 to 0.6 inclusive.

The first free sublayer 503*a* may be formed from CoFcB in which B is approximately 10-30%, and the ratio of Co/Fe may be approximately 0.3-2.0. The second free sublayer 503*b* may be formed from CoFeX or CoFeBX in which X is a diluent element, such as vanadium (V), molybdenum (Mo), titanium (Ti), zirconium (Zr), hafnium (Hf), aluminum (Al), niobium (Nb), tantalum (Ta), chromium (Cr), rhodium (Rh) or bismuth (Bi). The thickness of the free magnetic region 503 (FL1+FL2) depends on the in-plane CD, which may vary from 0.5*CD to 5.0*CD inclusive.

The secondary tunnel barrier 503*c* may have a resistance-area product (RA) of approximately 0.1-3.0 Ohm*$\mu m^2$ and may provide a tunnel magnetoresistance of greater than 50%. In one embodiment, the secondary tunnel barrier 503*c* may be formed from MgO, $Al_2O_3$ or may be a Mg—Al—O mixture. Alternatively, the secondary tunnel barrier 503*c* may be formed from Al—O, Mg—Al—O, Ti—O, Zr—O, Sc—O. Sr—O or a combination of oxides. The thickness of the secondary tunnel barrier 503*c* may be between 0.3 nm and 2.5 nm inclusive. In an alternative embodiment, the secondary tunnel barrier 503*c* may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The capping region 504 may be formed on the second free sublayer 503*b* opposite from the secondary tunnel barrier 503*c*. The capping region 504 may be a PMA-controlling (i.e., increasing PMA) layer, such as one or more of MgO, TaO, NiO, NbO, IrO, NaO, RhO, or OsO. The thickness of the capping region 504 may range from 0.3 nm to 2.5 nm inclusive. As the oxide capping region 504 can reduce TMR by serial parasitic resistance, the capping region 504 may be shunted on purpose by the process of forming the MTJ.

FIG. 5A depicts how anti-parallel-to-parallel (AP→P) switching occurs in the MTJ 500. In FIG. 5A, because the coupling across the secondary TB is small, two-step switching from AP→P occurs as follows. During the first switching step, the first free sublayer 503*a* switches based on two STT effects that are indicated at 510 and 511. The first STT effect 510 is based on the main tunnel barrier 502. The second STT 511 effect is based on the secondary tunnel barrier 503*c*. The two STTs 510 and 511 add and the first free sublayer 503*a* is "easy" to switch. The density of the switching current may be ½*$J_c$. The second free sublayer 503*b* is stabilized by the secondary STT effect indicated at 512 and makes it "harder" for the second free sublayer 503*b* to switch. During the second switching step, the weaker free sublayer 503*b* switches after the first free sublayer 503*a* switches based on the secondary STT.

FIG. 5B depicts how parallel-to-anti-parallel (P→AP) switching occurs in the MTJ 500. In FIG. 5B, the two-step switching from P→AP begins with the second free sublayer 503*b*, which is weaker and switches first. The effect of the STT at 513 is not cancelled, so switching may start in the second free sublayer 503*b*. The STTs at 514 and 515 nearly cancel, so the first free sublayer 503*a* is harder to switch until sublayer 503*b* is switched.

For both P→AP and AP→P switching directions, the harder FL layer (first free sublayer 503*a*) switches by action of a combined STT effect (roughly 2× stronger) and the weaker sublayer (second free layer 503*b*) switches by action of a single STT.

An asymmetric MgO insertion layer (i.e., the secondary tunnel barrier 503*c*, which provides a thicker first free sublayer 503*a*) allows a reduction of switching current for both P→AP and AP→P switching directions. For P→AP switching direction, the top layer (weaker) switches first and the bottom layer switches second.

Figures 6, 7, 8:
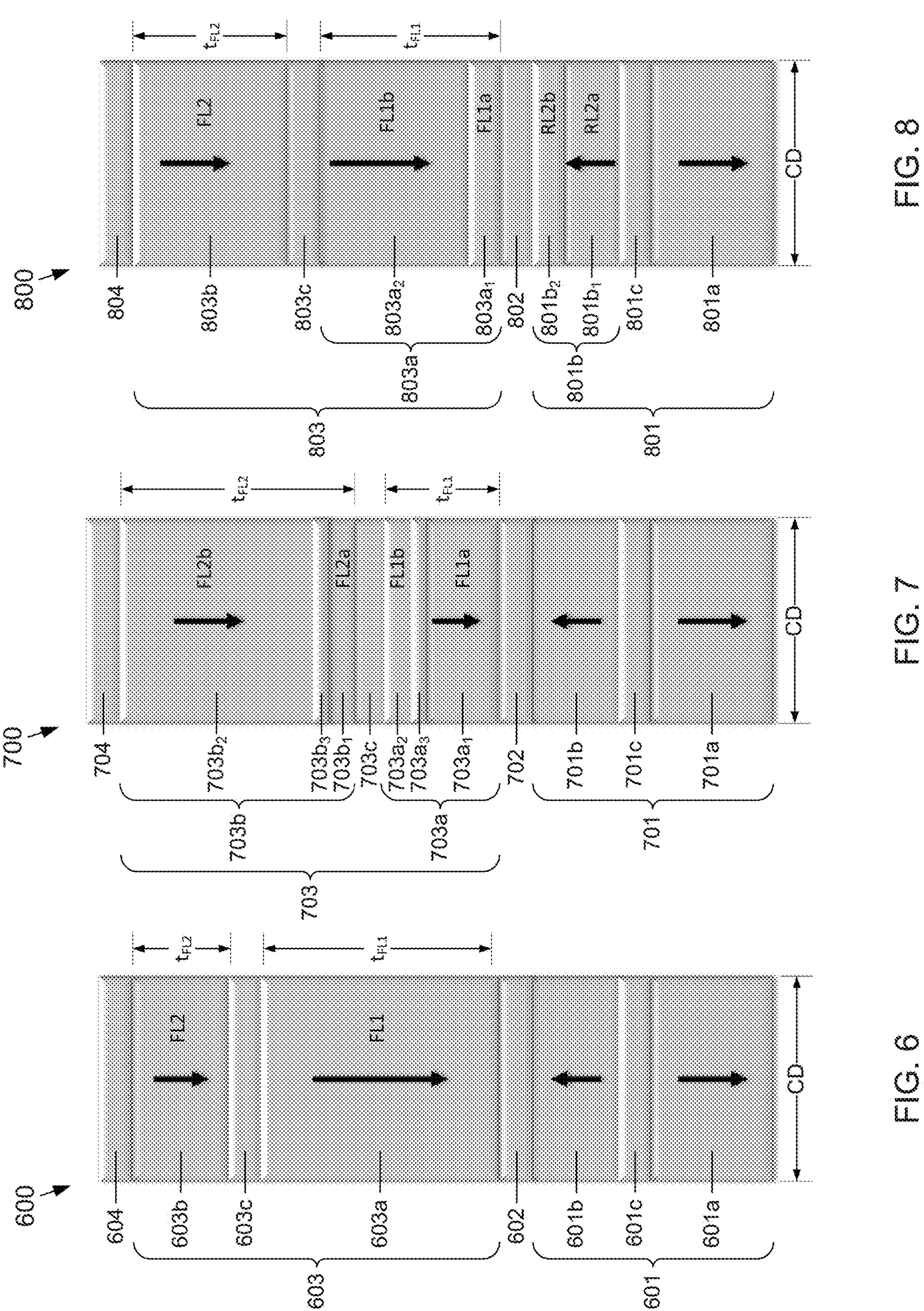
FIG. 6 depicts a sixth example embodiment of an MTJ bit structure having perpendicular shape anisotropy with dual spin filtering according to the subject matter disclosed herein.
FIG. 7 depicts a seventh example embodiment of an MTJ bit structure having perpendicular shape anisotropy with dual spin filtering according to the subject matter disclosed herein.
FIG. 8 depicts an eighth example embodiment of an MTJ bit structure having perpendicular shape anisotropy with dual spin filtering according to the subject matter disclosed herein.

FIG. 6 depicts a sixth example embodiment of an MTJ bit structure 600 having PSA with DSF according to the subject matter disclosed herein. The MTJ 600 is similar to the structure of the MTJ 500, except that the $Ms_{FL1}$ may be approximately equal to $Ms_{FL2}$, and that thickness asymmetry may be used.

The MTJ 600 may include a reference magnetic region 601, a main barrier region 602, a free magnetic region 603, and a capping region 604. The MTJ 600 may be formed on a substrate (not shown) that may include other components and/or connections (also not shown).

The reference magnetic region 601 may include at least two magnetic regions 601*a* and 601*b* that are separated by a coupling region 601*c*. The magnetic region 601*a* may be formed on a substrate (not shown). The coupling region 601*c* may be formed on the magnetic region 601*a* opposite from the substrate. The magnetic region 601*b* may be formed on the coupling region 601*c* opposite from the magnetic region 601*a*. Together the two magnetic regions 601*a* and 601*b*, and the coupling region 601*c* form an SAF region. The anti-parallel magnetic directions of the magnetic regions 601*a* and 601*b* are indicated by arrows within the regions 601*a* and 601*b*. The regions 601*a* and 601*b* may be formed from one or more of ferromagnetic elements Ni, Fe, and/or Co, including alloys or engineered materials with one or more of the elements Pd, Pt, Ni, and alloys thereof. The coupling region 601*c* may be an AF coupling region that includes non-ferromagnetic materials, such as Ir, Ru, Re, Rh or alloys thereof. The thickness of the non-ferromagnetic material(s) may range from 0.4 nm to 2.0 nm inclusive.

The main barrier region 602 may be formed on the magnetic region 601*b* opposite from the coupling region 601*c*. The main barrier region 602 may be formed from an oxide, such as MgO. Alternatively, the main barrier region 602 may be formed from Al—O, Mg—Al—O, Ti—O, Zr—O, Sc—O, Sr—O or a combination of oxides. The thickness of the main barrier region 602 may range from 0.3 nm to 2.5 nm inclusive. In an alternative embodiment, the main barrier region 602 may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The free magnetic region 603 of the MTJ 600 may include a first free sublayer (FL1) 603*a*, a second free sublayer (FL2) 603*b*, and a secondary tunnel barrier 603*c*. The first free sublayer 603*a* may be formed on the main barrier region 602 opposite the magnetic region 601*b*. The secondary tunnel barrier 603*c* may be formed on the first free sublayer 603*a* opposite from the main barrier region 602. The second free sublayer 603*b* may be formed on the secondary tunnel barrier 603*c* opposite from the first free sublayer 603*a*. The $Ms_{FL1}$ of the first free sublayer 603*a* may be approximately equal to the $Ms_{FL2}$ of the second free sublayer 603*b*. In one embodiment, a ratio of $Ms_{FL1}/Ms_{FL2}$ may range from 0.8 to 1.2 inclusive. The ratio thicknesses of second free sublayer 603*b* to the first free sublayer 603*a* may be approximately 2 to 4 (i.e., $t_{FL2}/t_{FL1}\approx 2\text{-}4$) so that the second free sublayer 603*b* is easier to switch than the first free sublayer 603*a*.

The first free sublayer 603*a* and the second free sublayer 603*b* may be formed from CoFeB in which B is approximately 10-30%, and the ratio of Co/Fe may be approximately 0.3-2.0. The thickness of the free magnetic region 603 depends on the in-plane CD, which may vary from 0.5*CD to 5.0*CD inclusive.

The secondary tunnel barrier 603*c* may have a RA of approximately 0.1-3.0 Ohm*$\mu m^2$ and may provide a tunnel magnetoresistance of greater than 50%. In one embodiment, the secondary tunnel barrier 603*c* may be formed from MgO, $Al_2O_3$ or may be a Mg—Al—O mixture. Alternatively, the secondary tunnel barrier 603*c* may be formed from Al—O, Mg—Al—O, Ti—O, Zr—O, Sc—O, Sr—O or a combination of oxides. The thickness of the secondary tunnel barrier 603*c* may range from 0.3 nm to 2.5 nm inclusive. In an alternative embodiment, the secondary tunnel barrier 603*c* may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The capping region 604 may be formed on the second free sublayer 603*b* opposite from the secondary tunnel barrier 603*c*. The capping region 604 may be a PMA-controlling (i.e., increasing PMA) layer, such as one or more of MgO, TaO, NiO, IrO, NaO, RhO, or OsO. The thickness of the capping region 604 may range from 0.3 nm to 2.5 nm inclusive. As the oxide capping region 604 can reduce TMR by serial parasitic resistance, the capping region 604 may be shunted on purpose by the process of forming the MTJ.

FIG. 7 depicts a seventh example embodiment of an MTJ bit structure having PSA with DSF according to the subject matter disclosed herein. The seventh example embodiment MTJ 700 is similar to the fifth and sixth example embodiments MTJ 500 and MTJ 600 using PSA with DSF, but with two insertion sublayers (FL1*b* and FL2*a*) that are next to the secondary tunnel barrier (which may be a metallic spacer in certain embodiments). Additionally, an MTJ 700 includes a first insertion sublayer (FL1*b*) and a second insertion sublayer (FL2*a*). Similar to the fifth embodiment, Ms asymmetry may be used, and similar to the sixth embodiment, thickness asymmetry may be used. One or more optional Texture Blocking Layers (TBLs) may be formed in a first free sublayer and a second free sublayer to provide diffusion blocking to maintain proper composition of a Heusler material after annealing, and to provide a proper seed for the Heusler material (e.g., for insertion sublayer FL1*b*). The one or more TBLs may be formed from a block crystallographic texture of an insertion material (e.g., Heusler).

The MTJ 700 may include a reference magnetic region 701, a main barrier region 702, a free magnetic region 703, and a capping region 704. The MTJ 700 may be formed on a substrate (not shown) that may include other components and/or connections (also not shown).

The reference magnetic region 701 may include at least two magnetic regions 701*a* and 701*b* that are separated by a coupling region 701*c*. The magnetic region 701*a* may be formed on a substrate (not shown). The coupling region 701*c* may be formed on the magnetic region 701*a* opposite from the substrate. The magnetic region 701*b* may be formed on the coupling region 701*c* opposite from the magnetic region 701*a*. Together the two magnetic regions 701*a* and 701*b*, and the coupling region 701*c* form an SAF region. The anti-parallel magnetic directions of the magnetic regions 701*a* and 701*b* are indicated by arrows within the regions 701*a* and 701*b*. The regions 701*a* and 701*b* may be formed from one or more of ferromagnetic elements Ni, Fe, and/or Co, including alloys or engineered materials with one or more of the elements Pd, Pt, Ni, and alloys thereof. The coupling region 701*c* may be an AF coupling region that includes non-ferromagnetic materials, such as Ir, Ru, Re, Rh or alloys thereof. The thickness of the non-ferromagnetic material(s) may range from 0.4 nm to 2.0 nm inclusive.

The main barrier region 702 may be formed on the magnetic region 701*b* opposite from the coupling region 701*c*. The main barrier region 702 may be formed from an oxide, such as MgO. Alternatively, the main barrier region 702 may be formed from Al—O, Mg—Al—O, Ti—O. Zr—O, Sc—O, Sr—O or a combination of oxides. The thickness of the main barrier region 702 may range from 0.3 nm and 2.5 nm inclusive. In an alternative embodiment, the main barrier region 702 may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The free magnetic region 703 may include a first free sublayer 703*a*, a second free sublayer 703*b*, and a secondary tunnel barrier 703*c*. The $Ms_{FL2}$ of the second free sublayer 703*b* may be approximately half of the $Ms_{FL1}$ of the first free sublayer 703*a* (i.e., $Ms_{FL2}\approx 0.5Ms_{FL1}$). In one embodiment, a ratio of $Ms_{FL2}/Ms_{FL1}$ may range from 0.4 to 0.6 inclusive. The ratio thicknesses of second free sublayer 703*b* to the first free sublayer 703*a* may be approximately 2 to 4 (i.e., $t_{FL2}/t_{FL1}\approx 2\text{-}4$). These two conditions work together so that the second free sublayer 703*b* is easier to switch than the first free sublayer 703*a*.

The first free sublayer 703*a* may include a free sublayer 703$a_1$ (FL1*a*), an insertion layer 703$a_2$ (FL1*b*), and an optional Texture Blocking Layer (TBL) 703$a_3$ (i.e., FL1=FL1*a*+FL1*b*). The free sublayer 703$a_1$ may be formed on the main barrier region 702 opposite from the second magnetic region 701*b*. The TBL 703$a_3$ may be formed on the free sublayer 703$a_1$ opposite from the main barrier region 702. When the TBL 703$a_3$ is present, the insertion layer $703a_2$ may be formed on the TBL $703a_3$ opposite from the free sublayer $703a_1$. When the TBL $703a_3$ is not present, the insertion layer $703a_2$ may be formed on the free sublayer $703a_1$ opposite the main barrier region 702.

The second free layer 703*b* may include an insertion layer $703b_1$ (FL2*a*), a free sublayer $703b_2$ (FL2*b*), and an optional TBL $703b_3$, (i.e., FL2=FL2*a*+FL2*b*) The insertion layer $703b_1$ may be formed on the secondary barrier layer 703*c* opposite from the free sublayer $703a_2$. The TBL $703b_3$ may be formed on the insertion layer $703b_1$ opposite from the secondary tunnel barrier 703*c*. When the TBL $703b_3$ is present, the free sublayer $703b_2$ may be formed on the TBL $703b_3$ opposite from the insertion layer $703b_1$. When the TBL $703b_3$ is not present, the free sublayer $703b_2$ may be formed on the insertion layer $703b_1$ opposite from the secondary tunnel barrier 703*c*.

The first free sublayer 703*a* may be formed from CoFeB in which B is approximately 10-30%, and the ratio of Co/Fe may be approximately 0.3-2.0. The second free sublayer 703*b* may be formed from CoFeX or CoFeBX in which X is a diluent element, such as vanadium (V), molybdenum (Mo), titanium (Ti), zirconium (Zr), hafnium (Hf), aluminum (Al), niobium (Nb), tantalum (Ta), chromium (Cr), rhodium (Rh) or bismuth (Bi). The thickness of the free magnetic region 703 (FL1+FL2) depends on the in-plane CD, which may vary from 0.5*CD to 5.0*CD inclusive.

The materials forming the layers $703a_2$ and $703b_1$ have a high polarization, a low damping, and may have a high Ms to increase polarization and TMR of a secondary tunnel barrier 703*c*, which in one embodiment may be a metal spacer. Example high-Ms materials that may be used for the layers $703a_2$ and $703b_1$ include CoFe and Heusler compounds and the thickness of insertion layers $703a_2$ and $703b_1$ may range from 0.2 nm to 2 nm inclusive.

The optional Texture Blocking Layers $703a_3$ and $703b_3$ may be respectively formed in the first free sublayer 703*a* and the second free sublayer 703*b* to provide diffusion blocking to maintain proper composition of Heusler material after annealing, and to provide a proper seed for the Heusler compound (e.g., for FL1*b*). One or both of the TBLs $703a_3$ and $703b_3$ may be used. As depicted in FIG. 7, a TBL $703a_3$ may be formed in the first free layer 703*a* between the free layer $703a_1$ and the insertion layer $703b_2$. Similarly, a TBL $703b_3$ may be formed in the second free layer 703*b* between the insertion layer $703b_1$ and the free layer $703b_2$. Each TBL may be formed to block crystallographic texture of insertion material to increase read signal from the Heusler compound. Materials that may be used for the TBLs are usually amorphous and may include W, Ta, Mo, Nb, CoFe+X or CoFeB+X in which X may be W, Ta, Mo and/or Nb.

The secondary tunnel barrier 703*c* may have a RA of approximately 0.1-3.0 Ohm*$\mu m^2$ and may provide a tunnel magnetoresistance of greater than 50%. Alternatively, the secondary tunnel barrier 703*c* may be formed from MgO, $Al_2O_3$ or may be a Mg—Al—O mixture. In another alternative embodiment, the secondary tunnel barrier 703*c* may be formed from Al—O, Mg—Al—O, Ti—O, Zr—O, Sc—O, Sr—O or a combination of oxides. The thickness of the secondary tunnel barrier 703*c* may range from 0.3 nm to 2.5 nm inclusive. In still another alternative embodiment, the secondary tunnel barrier 703*c* may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The capping region 704 may be formed on the free sublayer $703b_2$ opposite from the TBL $703b_3$ when the TBL $703b_3$ is present. When the TBL $703b_3$ is not present, the capping region 704 may be formed on the free sublayer $703b_2$ opposite from the free sublayer $703b_1$. The capping region 704 may be a PMA-controlling (i.e., increasing PMA) layer, such as one or more of MgO, TaO, NiO, IrO, NaO, RhO, or OsO. The thickness of the capping region 704 may range from 0.3 nm to 2.5 nm inclusive. As the oxide capping region 704 can reduce TMR by serial parasitic resistance, the capping region 704 may be shunted on purpose by the process of forming the MTJ.

FIG. 8 depicts an eighth example embodiment of an MTJ bit structure 800 having PSA with DSF according to the subject matter disclosed herein. In FIG. 8, the main spacer 802 may be a metallic layer to reduce RA for small CDs. The first free layer and the second reference layer may include insertion layers to maximize TMR that may be formed from the same materials forming the insertion layers of the MTJ 700 The thickness of insertion layers may range from 0.2 nm to 2 nm.

The MTJ 800 may include a reference magnetic region 801, a main barrier region 802, a free magnetic region 803, and a capping region 804. The MTJ 800 may be formed on a substrate (not shown) that may include other components and/or connections (also not shown).

The reference magnetic region 801 may include at least two magnetic regions 801*a* and 801*b* that are separated by a coupling region 801*c*. The magnetic region 801*a* may be formed on a substrate (not shown). The coupling region 801*c* may be formed on the magnetic region 801*a* opposite from the substrate. The magnetic region 801*b* may be formed on the coupling region 801*c* opposite from the magnetic region 801*a*. Together the two magnetic regions 801*a* and 801*b*, and the coupling region 801*c* form an SAF region. The anti-parallel magnetic directions of the magnetic regions 801*a* and 801*b* are indicated by arrows within the regions 801*a* and 801*b*. The regions 801*a* and 801*b* may be formed from one or more of ferromagnetic elements Ni, Fe, and/or Co, including alloys or engineered materials with one or more of the elements Pd, Pt, Ni, and alloys thereof. The coupling region 801*c* may be an AF coupling region that includes non-ferromagnetic materials, such as Ir, Ru, Re, Rh or alloys thereof. The thickness of the non-ferromagnetic material(s) may range from 0.4 nm to 2.0 nm inclusive.

The second reference magnetic region 801*b* may include an insertion layer $801b_2$ so that the second reference magnetic region 801*b* is formed from a reference layer $801b_1$ (RL2*a*) and the insertion layer $801b_2$ (RL2*b*). The insertion layer $801b_2$ may be formed on the reference layer $801b_1$ opposite from the coupling region 801*c*. The insertion layer $801b_2$ may be formed from a material having a high polarization, a low damping, and may have a high Ms to increase polarization and TMR. Example high-Ms materials that may be used may include CoFe and Heusler compounds. The thickness of insertion layer $801b_2$ may range from 0.2 nm to 2 nm inclusive.

The main barrier region 802 may be formed on the insertion layer $801b_2$ opposite from the reference layer $801b_1$. The main barrier region 802 may be formed from an oxide, such as MgO. Alternatively, the main barrier region 802 may be formed from Al—O, Mg—Al—O, Ti—O. Zr—O, Sc—O, Sr—O or a combination of oxides. The thickness of the main barrier region 802 may range from 0.3 nm and 2.5 nm inclusive. In an alternative embodiment, the main barrier region 802 may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The free magnetic region 803 may include a first free layer 803_a_, a second free layer (FL2) 803_b_ and a secondary tunnel barrier 803_c_. The $Ms_{FL2}$ of the second free layer 803_b_ may be approximately half of the $Ms_{FL1}$, of the first free layer 803_a_ (i.e., $Ms_{FL2} \approx 0.5Ms_{FL1}$). In one embodiment, a ratio of $Ms_{FL2}/Ms_{FL1}$ may range from 0.4 to 0.6 inclusive. The thickness of second free layer 803_b_ may be approximately equal to the thickness of the first free layer 803_a_ (i.e., $t_{FL2} \approx t_{FL1}$). In one embodiment, a ratio of $t_{FL2}/t_{FL1}$ may range from 0.8 to 1.2 inclusive. These two conditions work together so that the second free layer 803_b_ is easier to switch than the first free layer 803_a_.

The first free sublayer 803_a_ may include an insertion layer 803$a_1$ (FL1_a_) and a free sublayer 803$a_2$ (FL1_b_) (i.e., FL1=FL1_a_+FL1_b_). The insertion layer 803$a_1$ may be formed on the main barrier region 802 opposite from the insertion layer 801$b_2$. The free sublayer 803$a_2$ may be formed on the insertion layer 803$a_1$ opposite from the main barrier region 802. The thickness of insertion layer 803$b_1$ may range from 0.2 nm to 2 nm. The insertion layer 803$a_1$ may be formed from a material having a high polarization, a low damping, and may have a high Ms to increase polarization and TMR. Example high-Ms materials that may be used include CoFe and Heusler compounds. The first free layer 803$a_2$ may be formed from CoFeB in which B is approximately 10-30%, and the ratio of Co/Fe may be approximately 0.3-2.0.

The secondary tunnel barrier 803_c_ may be formed on the first free layer 803$a_2$ opposite from the insertion layer 803$a_1$. The secondary tunnel barrier 803_c_ may have a RA of approximately 0.1-3.0 Ohm*$\mu m^2$ and may provide a tunnel magnetoresistance of greater than 50%. Alternatively, the secondary tunnel barrier 803_c_ may be formed from MgO, $Al_2O_3$ or may be a Mg—Al—O mixture. In another alternative embodiment, the secondary tunnel barrier 803_c_ may be formed from Al—O, Mg—Al—O, Ti—O, Zr—O, Sc—O, Sr—O or a combination of oxides. The thickness of the secondary tunnel barrier 803_c_ may range from 0.3 nm and 2.5 nm inclusive. In still another alternative embodiment, the secondary tunnel barrier 803_c_ may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The second free sublayer 803_b_ may be formed on the secondary tunnel barrier 803_c_ opposite from the first free sublayer 803$a_2$. The second free layer 803_b_ may be formed from CoFeX or CoFeBX in which X is a diluent element, such as vanadium (V), molybdenum (Mo), titanium (Ti), zirconium (Zr), hafnium (Hf), aluminum (Al), niobium (Nb), tantalum (Ta), chromium (Cr), rhodium (Rh) or bismuth (Bi). The thickness of the free magnetic region 803 (FL1+FL2) depends on the in-plane CD, which may vary from 0.5*CD to 5.0*CD inclusive.

The capping region 804 may be formed on the second free sublayer 803_b_ opposite from the secondary tunnel barrier 803_c_. The capping region 804 may be a PMA-controlling (i.e., increasing PMA) layer, such as one or more of MgO, TaO, NiO, IrO, NaO, RhO, or OsO. The thickness of the capping region 804 may range from 0.3 nm to 2.5 nm inclusive. As the oxide capping region 804 can reduce TMR by serial parasitic resistance, the capping region 804 may be shunted on purpose by the process of forming the MTJ.

Perpendicular Shape Anisotropy Design with Asymmetric Composite FL (ACFL)

A third type of MTJ bit structure disclosed herein includes PSA with an asymmetric composite free layer (ACFL). The ninth through eleventh embodiments (FIGS. 9-11) are third type MTJ bit structures. The ACFL may provide an improved FOM by around 2× over the FOM of a conventional MTJ. A "softer" free layer in which it is easier to change magnetic direction of the layer is next to a main tunnel barrier and includes a coupled bilayer of the first free layer and the second free layer. The first free layer FL1 is softer (easier to switch) and has smaller Ms or thickness than the second free layer. The coupling layer provides ferromagnetic coupling that ranges between 0.5-1.5 erg/$cm^2$ inclusive. A third type MTJ bit structure may have a CD that ranges from 4 nm to 22 nm inclusive, and may have an AR for the entire free magnetic layer (free magnetic region) stack (($t_{FLB}$+$t_{FLT}$)/CD) of between 1.0 and 2.5 inclusive.

Figures 9, 10, 11:
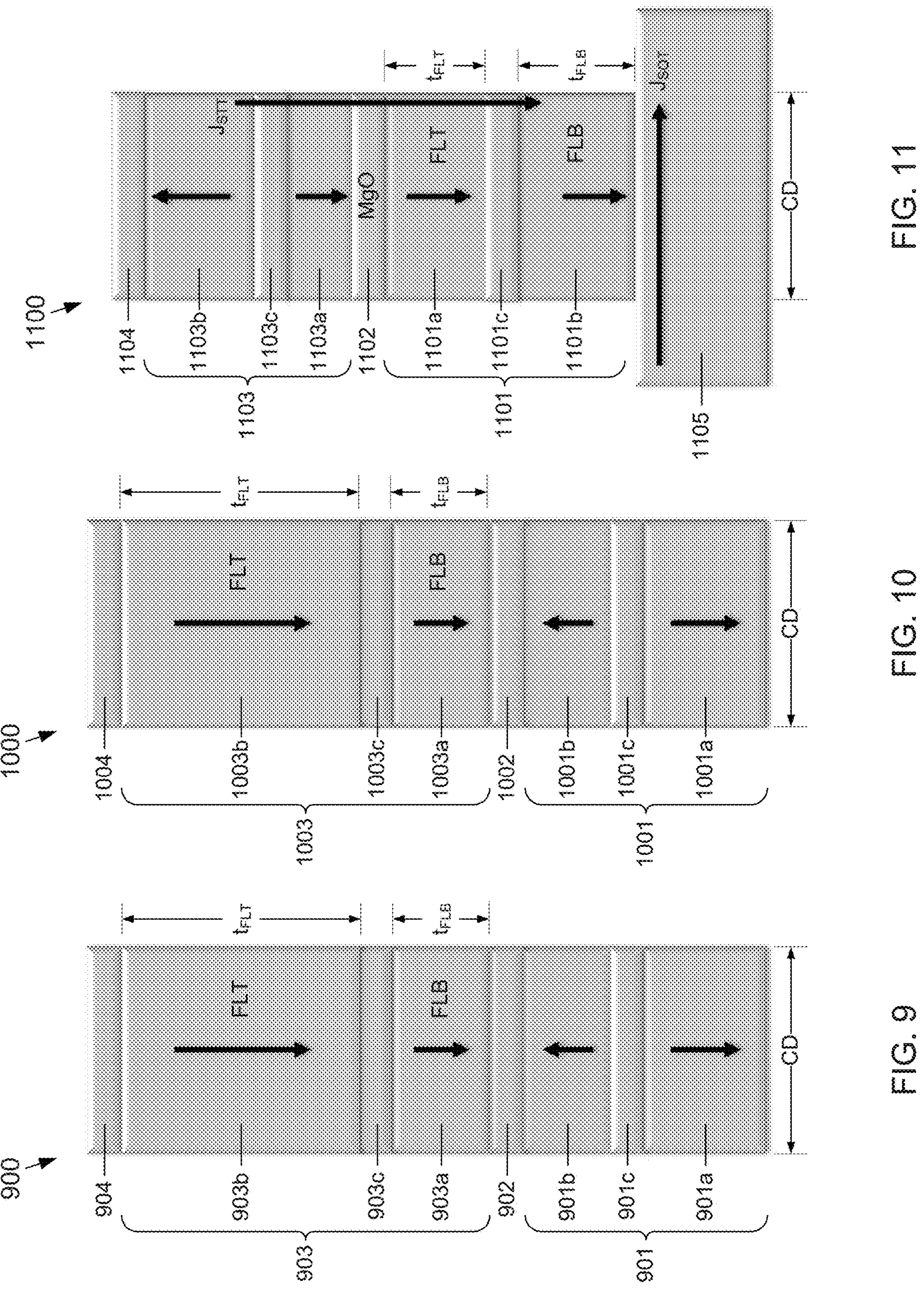
FIG. 9 depicts a ninth example embodiment of an MTJ bit structure having perpendicular shape anisotropy with an asymmetric composite free layer according to the subject matter disclosed herein.
FIG. 10 depicts a tenth example embodiment of an MTJ bit structure having perpendicular shape anisotropy with an asymmetric composite free layer according to the subject matter disclosed herein.
FIG. 11 depicts an eleventh example embodiment of an MTJ bit structure having perpendicular shape anisotropy with an asymmetric composite free layer according to the subject matter disclosed herein.

FIG. 9 depicts a ninth example embodiment of an MTJ bit structure 900 having PSA with ACFL according to the subject matter disclosed herein. The MTJ 900 may include a reference magnetic region 901, a main barrier region 902, a free magnetic region 903, and a capping region 904. The MTJ 900 may be formed on a substrate (not shown) that may include other components and/or connections (also not shown).

The reference magnetic region 901 may include at least two magnetic regions 901_a_ and 901_b_ that are separated by a coupling region 901_c_. The magnetic region 901_a_ may be formed on a substrate (not shown). The coupling region 901_c_ may be formed on the magnetic region 901_a_ opposite from the substrate. The magnetic region 901_b_ may be formed on the coupling region 901_c_ opposite from the magnetic region 901_a_. Together the two magnetic regions 901_a_ and 901_b_, and the coupling region 901_c_ form an SAF region. The anti-parallel magnetic directions of the magnetic regions 901_a_ and 901_b_ are indicated by arrows within the regions 901_a_ and 901_b_. The regions 901_a_ and 901_b_ may be formed from one or more of ferromagnetic elements Ni, Fe, and/or Co, including alloys or engineered materials with one or more of the elements Pd, Pt, Ni, and alloys thereof. The coupling layer 901_c_ may be an AF coupling region that includes non-ferromagnetic materials, such as Ir, Ru, Re, Rh or alloys thereof. The thickness of the non-ferromagnetic material(s) may range from 0.4 nm to 2.0 nm inclusive.

The main barrier region 902 may be formed on the magnetic region 901_b_ opposite from the coupling region 901_c_. The main barrier region 902 may be formed from an oxide, such as MgO. Alternatively, the main barrier region 902 may be formed from Al—O, Mg—Al—O, Ti—O, Zr—O, Sc—O, Sr—O or a combination of oxides. The thickness of the main barrier region 902 may range from 0.3 nm and 2.5 nm inclusive. In an alternative embodiment, the main barrier region 902 may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The free magnetic region of the MTJ 900 may include a first free sublayer (FLB) 903_a_, a second free sublayer (FLT) 903_b_ and a secondary coupling layer 903_c_. The first free sublayer 903_a_ may be formed on the main barrier region 902 opposite the magnetic region 901_b_. The secondary coupling layer 903_c_ may be formed on the first free sublayer 903_a_ opposite from the main barrier region 902. The second free sublayer 903_b_ may be formed on the secondary coupling layer 903_c_ opposite from the first free sublayer 903_a_. The ratio of $Mst_{FL2}$ of the second free sublayer 903*b* to the $Mst_{FL1}$ of the first free sublayer may be approximately 2-5, which ensures that the first free sublayer 903*a* is easier to switch than the second free sublayer 903*b*. The first free sublayer 903*a* may be formed from Co—Fe—X or Co—Fe—B—X in which X is a diluent element, such as V, Mo, Ti, Zr, Hf, Al, Nb, Ta, Cr, Rh or Bi. The second free sublayer 903*b* may be formed from Co—Fe or Co—Fe—B in which B is approximately 10-30%, and the ratio of Co/Fe may be approximately 0.3-2.0. In one embodiment, a ratio of $t_{FLT}/t_{FLB}$ may range from 4.0 to 1.0 inclusive.

In one embodiment, the secondary coupling layer 903*c* may be formed from a weakly ferromagnetic material, such as Co—Fe—X in which X may be Mo, W, Ta, Cr, Hf, Nb, Ti, Zr and Ni. In another embodiment, the secondary coupling layer 903*c* may be formed from a thin oxide layer, such as MgO, AlO, MAO (Magnesium Aluminum Oxide) or NiO. In still another embodiment, the secondary coupling layer 903*c* may be formed from a thin non-magnetic layer having a high melting temperature or a low diffusion, such as W, Mo or Ta. A desired degree of coupling provided by the secondary coupling layer 903*c* may range from 0.5-3.0 $erg/cm^2$ inclusive.

Selection of the insertion position of the secondary coupling layer 903*c* within the free magnetic region 903 may be characterized by the ratio $t_{FLB}/(t_{FLB}+T_{FLT})$ in which if the ratio is selected to be equal to 0.5, the insertion position is in the middle of the free magnetic region 903. If the ratio is selected to be less than 0.5, the insertion position of the secondary coupling layer 903*c* is closer to the main barrier region 902 (i.e., the bottom sublayer of the free layer 903 is thinner). If the ratio is selected to be greater than 0.5, the insertion position of the secondary coupling layer 903*c* is closer to the capping region 904 (i.e., the bottom sublayer of the free layer 903 is thicker).

The capping region 904 may be formed on the second free sublayer 903*b* opposite from the secondary coupling layer 903*c*. The capping region 904 may be a PMA-controlling (i.e., increasing PMA) layer, such as one or more of MgO, TaO, NiO, IrO, NaO, RhO, or OsO. The thickness of the capping region 904 may range from 0.3 nm to 2.5 nm inclusive. As the oxide capping region 904 can reduce TMR by serial parasitic resistance, the capping region 904 may be shunted on purpose by the process of forming the MTJ.

FIG. 10 depicts a tenth example embodiment of an MTJ bit structure 1000 having PSA with ACFL according to the subject matter disclosed herein. The MTJ 1000 is similar to the MTJ 900 in FIG. 9, but differs by the materials of the free magnetic region including Heusler compounds, such as but not limited to $Co_2FeAl$. Additionally, the main tunnel barrier 902 of the MTJ 900 is replaced by a metallic spacer that provides high polarization (and GMR) in combination with Heusler materials for the first and second free layers of the free magnetic region.

The MTJ 1000 may include a reference magnetic region 1001, a main barrier region 1002, a free magnetic region 1003, and a capping region 1004. The MTJ 1000 may be formed on a substrate (not shown) that may include other components and/or connections (also not shown).

The reference magnetic region 1001 may include at least two magnetic regions 1001*a* and 1001*b* that are separated by a coupling region 1001*c*. The magnetic region 1001*a* may be formed on a substrate (not shown). The coupling region 1001*c* may be formed on the magnetic region 1001*a* opposite from the substrate. The magnetic region 1001*b* may be formed on the coupling region 1001*c* opposite from the magnetic region 1001*a*. Together the two magnetic regions 1001*a* and 1001*b*, and the coupling region 1001*c* form an SAF region. The anti-parallel magnetic directions of the magnetic regions 1001*a* and 1001*b* are indicated by arrows within the regions 1001*a* and 1001*b*. The regions 1001*a* and 1001*b* may be formed from one or more of ferromagnetic elements Ni, Fe, and/or Co, including alloys or engineered materials with one or more of the elements Pd. Pt, Ni, and alloys thereof. The coupling layer 1001*c* may be an AF coupling region that includes non-ferromagnetic materials, such as Ir, Ru, Re, Rh or alloys thereof. The thickness of the non-ferromagnetic material(s) may range from 0.4 nm to 2.0 nm inclusive.

The main barrier region 1002 may be formed on the magnetic region 1001*b* opposite from the coupling region 1001*c*. The main barrier region 1002 may be formed from a metallic spacer that provides high polarization and GMR in combination with Heusler materials forming the free magnetic region 1003.

The free magnetic region 1003 of the MTJ 1000 may include a first free sublayer (FLB) 1003*a*, a second free sublayer (FLT) 1003*b* and a secondary coupling layer 1003*c*. The first free sublayer 1003*a* may be formed on the main barrier region 1002 opposite the magnetic region 1001*b*. The secondary coupling layer 1003*c* may be formed on the first free sublayer 1003*a* opposite from the main barrier region 1002. The second free sublayer 1003*b* may be formed on the secondary coupling layer 1003*c* opposite from the first free sublayer 1003*a*. The ratio of $Mst_{FL2}$ of the second free layer 1003*b* to the $Mst_{FL1}$ of the first free layer may be approximately 2-5, which ensures that the first free layer (FLB) 1003*a* is easier to switch than the second free layer (FLT) 1003*b*. In one embodiment, the first free layer 1003*a* may be formed from Co—Fe—X or Co—Fe—B—X in which X is a diluent element, such as V, Mo, Ti, Zr, Hf, Al, Nb, Ta, Cr, Rh or Bi, and the second free layer 1003*b* may be formed from high Ms Heusler compounds. The thickness of the free magnetic region 1003 (FLB+FLT) depends on the in-plane CD, which may vary from 0.5*CD to 5.0*CD inclusive. In an alternative embodiment, the first free layer 1003*a* may be formed from high Ms Heusler compounds, and the second free layer 1003*b* may be formed from Co—Fe or Co—Fe—B in which B is approximately 10-30%, and the ratio of Co/Fe may be approximately 0.3-2.0. For this alternative embodiment, the thickness of the free magnetic region 1003 (FLB+FLT) depends on the in-plane CD, which may vary from 0.5*CD to 5.0*CD inclusive. Additionally, the thickness $t_{FLT}$ of the second free layer 1003*b* may range from 1.2 to 5.0 (inclusive) times thicker than the thickness $t_{FLB}$ of the first free layer 1003*a*.

The secondary coupling layer 1003*c* may be a weakly ferromagnetic material, such as Co—Fe—X in which X may be Mo, W, Ta, Cr. Nb. Alternatively, the coupling layer may be MgO, AlO, MAO or NiO. Still another alternative provides that the coupling layer may have a high melting temperature or low diffusion, such as tungsten (W), molybdenum (Mo) or tantalum (Ta). The coupling range of the secondary coupling layer 1003*c* may be between 0.5 and 3.0 $erg/cm^2$ inclusive.

The capping region 1004 may be formed on the second free sublayer 1003*b* opposite from the secondary coupling layer 1003*c*. The capping region 1004 may be a PMA-controlling (i.e., increasing PMA) layer, such as one or more of MgO, TaO, NiO, IrO, NaO, RhO, or OsO. The thickness of the capping region 1004 may range from 0.3 nm to 2.5 nm inclusive. As the oxide capping region 1004 can reduce TMR by serial parasitic resistance, the capping region 1004 may be shunted on purpose by the process of forming the MTJ.

FIG. 11 depicts an eleventh example embodiment of an MTJ bit structure 1100 having PSA with ACFL according to the subject matter disclosed herein. The MTJ 1100 has similarities to the MTJ 900 in FIG. 9, and includes an SOT line on which the reference magnetic region may be formed.

The MTJ 1100 may include a free magnetic region 1101, a main barrier region 1102, a reference magnetic region 1103, and a capping region 1104 that are all formed on an SOT line 1105. The free magnetic region 1101 of the MTJ 1100 may include a first free sublayer (FLB) 1101*a*, a second free sublayer (FLT) 1101*b* and a secondary coupling layer 1101*c*. The first free sublayer 1101*a* may be formed on the SOT line 1105. The secondary coupling layer 1101*c* may be formed on the first free sublayer 1101*a* opposite from the SOT line 1105. The second free sublayer 1101*b* may be formed on the secondary coupling layer 1101*c* opposite from the first free sublayer 1101*a*. The ratio of $Mst_{FLT}$ of the second free sublayer 1101*b* to the $Mst_{FLB}$ of the first free sublayer 1101*a* may be approximately 2-5, which ensures that the first free sublayer 1101*a* is easier to switch than the second free sublayer 1101*b*.

The first free sublayer 1101*a* may be formed from Co—Fe—X or Co—Fe—B—X in which X is a diluent element, such as V, Mo, Ti, Zr, Hf, Al, Nb, Ta, Cr, Rh or Bi. The second free sublayer 1101*b* may be formed from Co—Fe or Co—Fe—B in which B is approximately 10-30%, and the ratio of Co/Fe may be approximately 0.3-2.0. The thickness of the free magnetic region 1101 (FLB+FLT) depends on the in-plane CD, which may range from 0.5*CD to 5.0*CD inclusive. Additionally, the thickness $t_{FLT}$ of the second free sublayer 1101*b* may range from 1.5 to 5.0 times thicker than the thickness $t_{FLB}$ of the first free sublayer 1101*a*.

In one embodiment, the secondary coupling layer 1101*c* may be formed from a weakly ferromagnetic material, such as Co—Fe—X in which X may be Mo, W, Ta, Cr, Nb, Ti, Hf, Zr, and Ni. In another embodiment, the secondary coupling layer 1101*c* may be formed from a thin oxide layer, such as MgO, AlO, MAO or NiO. In still another embodiment, the secondary coupling layer 1101*c* may be formed from a thin non-magnetic layer having a high melting temperature or a low diffusion, such as tungsten (W), molybdenum (Mo) or tantalum (Ta). A desired degree of coupling provided by the secondary coupling layer 1101*c* may be between 0.5-3.0 erg/cm$^2$ inclusive.

The main barrier region 1102 may be formed on the second free sublayer 1101*b* opposite from the secondary coupling layer 1101*c*. The main barrier region 1102 may be formed from an oxide, such as MgO. Alternatively, the main barrier region 1102 may be formed from Al—O, Mg—Al—O, Ti—O, Zr—O, Sc—O, Sr—O or a combination of oxides. The thickness of the main barrier region 1102 may range from 0.3 nm to 2.5 nm inclusive. In an alternative embodiment, the main barrier region 1102 may be replaced by a conducting spacer layer, such as Cu, Ge, Ag, or other similar elements or combinations (including alloys and multilayers). For the conducting spacer layer, thicknesses may be increased and may range from 0.3 nm to 200 nm inclusive.

The reference magnetic region 1103 may include at least two magnetic regions 1103*a* and 1103*b* that are separated by a coupling layer 1103*c*. The magnetic region 1103*a* may be formed on the main barrier region 1102 opposite from the second free sublayer 1101*b*. The coupling region 1103*c* may be formed on the magnetic region 1103*a* opposite from the main barrier region 1102. The magnetic region 1103*b* may be formed on the coupling region 1103*c* opposite from the magnetic region 1103*a*. Together form the two magnetic regions 1103*a* and 1103*b*, and the coupling region 1103*c* an SAF region. The anti-parallel magnetic directions of the magnetic regions 1103*a* and 1103*b* are indicated by arrows within the regions 1103*a* and 1103*b*. The regions 1103*a* and 1103*b* may be formed from one or more of ferromagnetic elements Ni, Fe, and/or Co, including alloys or engineered materials with one or more of the elements Pd. Pt. Ni, and alloys thereof. The coupling layer 1103*c* may be an antiferromagnetic coupling region that includes non-ferromagnetic materials, such as Ir, Ru, Re, Rh or alloys thereof. The thickness of the non-ferromagnetic material(s) may range from 0.4 nm to 2.0 nm inclusive.

The capping region 1104 may be formed on the second magnetic region 1103*b* opposite from the coupling region 1103*c*. The capping region 1104 may be a PMA-controlling (i.e., increasing PMA) layer, such as one or more of MgO, TaO, NiO, IrO, NaO, RhO, or OsO. The thickness of the capping region 1104 may range from 0.3 nm to 2.5 nm inclusive. As the oxide capping region 1104 can reduce TMR by serial parasitic resistance, the capping region 1104 may be shunted on purpose by the process of forming the MTJ.

Materials that may be used to form the SOT line 1105 may include alloys of two or more materials of W, Pt, Tb, Bi, Se, Hf, Zr, Ag, Au, and Si materials (e.g., W—Hf) in which the materials used have some oxidation at the interface. Additionally, the previously listed materials may be formed to include multilayers (e.g., Au/Si). The topological insulators that may be used for the SOT line 1105 may be formed from (BiTe, BiSe, TlBiTe, TlBiSe, SbTeS, BiTeS, BiTeSe, GeSbTe, SnSbTe, GeBiTe, SnBiTe, BiSb, or BiSbSe).

Table 1 sets forth improvements for MTJ bit structure using PSA with DSF (embodiments 5-8 (FIGS. 5-8)) and for MTJ bit structures using PSA with asymmetric composite free layer (ACFL) (MTJ embodiments 9-11 (FIGS. 9-11)).

TABLE 1

| | MTJ using PSA with DSF | MTJ using PSA with ACFL |
|---|---|---|
| Benefits | Smaller $J_c$ | Higher $E_b$<br>Smaller $J_c$<br>No Intermediate States |
| Design aspects | Insertion Material:<br>Weak coupling<br>PMA is optional<br>STT is important<br>Thickness:<br>“Top” FL is thinner | Insertion Material:<br>Strong coupling<br>PMA is optional<br>No STT<br>Thickness:<br>“Bottom” FL layer is thinner |

Figure 12:
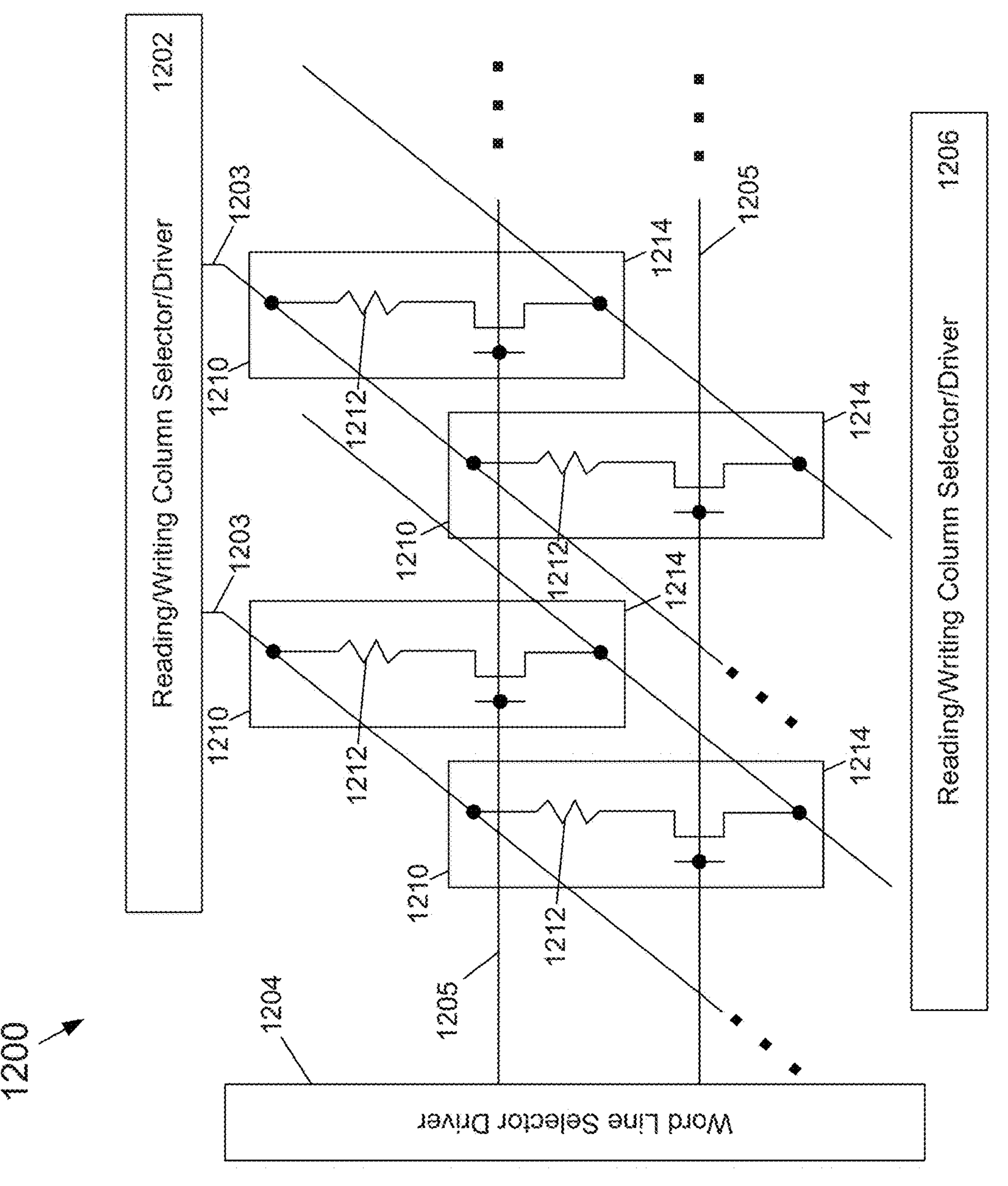
FIG. 12 depicts an exemplary embodiment of a memory that may use one or more of the magnetic junction bit structures disclosed herein.

FIG. 12 depicts an exemplary embodiment of a memory 1200 that may use one or more of the magnetic junction bit structures 100-1100 disclosed herein. The magnetic memory 1200 includes reading/writing column select drivers 1202 and 1206 as well as a word line select driver 1204. Other and/or different components not shown may also be provided. The storage region of the memory 1200 includes magnetic storage cells 1210. Each magnetic storage cell includes at least one magnetic junction 1212 and at least one selection device 1214. In some embodiments, the selection device 1214 may be a transistor. The magnetic junctions 1212 may be one of the MTJ bit structures 100-1100 disclosed herein. Although one magnetic junction 1212 is shown per cell 1210, in other embodiments, another number of magnetic junctions 1212 may be provided per cell. As such, the magnetic memory 1200 may provide the benefits described herein.

Figure 13:
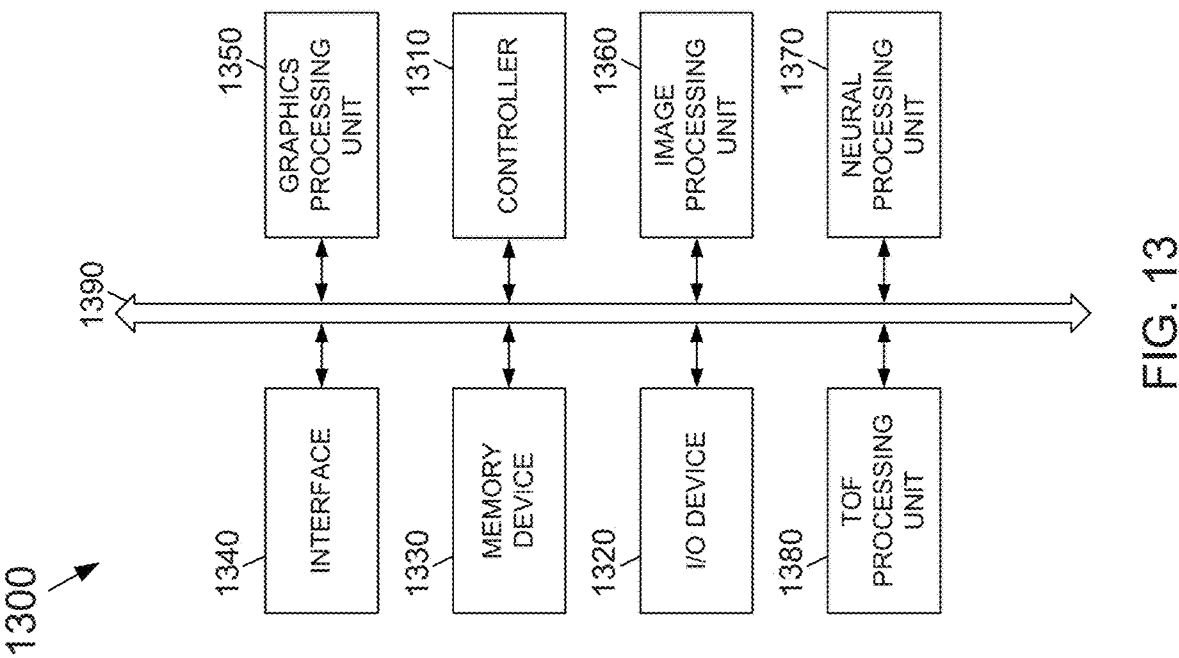
FIG. 13 depicts an electronic device that may include a memory device that includes magnetic tunnel junction bit structures according to the subject matter disclosed herein.

FIG. 13 depicts an electronic device 1300 that may include a memory device that includes magnetic tunnel junction bit structures according to the subject matter disclosed herein. Electronic device 1300 and the various system components of electronic device 1300 may be formed from one or modules. The electronic device 1300 may include a controller (or CPU) 1310, an input/output device 1320 such as, but not limited to, a keypad, a keyboard, a display, a touch-screen display, a 2D image sensor, a 3D image sensor, a memory 1330, an interface 1340, a GPU 1350, an imaging-processing unit 1360, a neural processing unit 1370, a TOF processing unit 1380 that are coupled to each other through a bus 1390. In one embodiment, the memory 1330 may include one or more magnetic tunnel junction bit structures according to the subject matter disclosed herein. In one embodiment, the 2D image sensor and/or the 3D image sensor may be part of the imaging processing unit 1360. In another embodiment, the 3D image sensor may be part of the TOF processing unit 1380. The controller 1310 may include, for example, at least one microprocessor, at least one digital signal processor, at least one microcontroller, or the like. The memory 1330 may be configured to store a command code to be used by the controller 1310 and/or to store a user data.

The interface 1340 may be configured to include a wireless interface that is configured to transmit data to or receive data from, for example, a wireless communication network using a RF signal. The wireless interface 1340 may include, for example, an antenna. The electronic system 1300 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), Fifth-Generation Wireless (5G), Sixth-Generation Wireless (6G), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A memory device, comprising:

a magnetic tunnel junction (MTJ) structure comprising perpendicular shape anisotropy, and the MTJ structure further comprising:

a reference layer comprising a first side and a second side that is opposite the first side of the reference layer;

a non-magnetic spacer comprising a first side and a second side, the first side of the non-magnetic spacer being on the second side of the reference layer and the second side of the non-magnetic spacer being opposite the first side of the non-magnetic spacer; and free layer comprising a first side and a second side, the first side of the free layer being on the second side of the non-magnetic spacer and the second side of the free layer being opposite the first side of the free layer, the free layer further comprising a first layer on the first side of the free layer, a second layer on the second side of the free layer and a coupling layer disposed between the first layer and the second layer, a saturation magnetization MsFL2 of the second layer being between 2 and 5 times inclusive a saturation magnetization MsFL1 of the first layer.

2. The memory device of claim 1, wherein the first layer is easier to switch magnetization directions than the second layer.

3. The memory device of claim 1, wherein a ratio of thickness of the first layer to a thickness of the first layer and the second layer is less than 0.5.

4. The memory device of claim 1, wherein:

a ratio of a thickness of the free layer to a critical dimension of the MTJ structure is between 0.5 and 5.0 inclusive, and the critical dimension of the MTJ structure ranges from 4 nanometers (nm) to 22 nm inclusive.

5. The memory device of claim 1, wherein the first layer comprises CoFeX or CoFeBX in which X is a diluent element comprising vanadium (V), molybdenum (Mo), titanium (Ti), zirconium (Zr), hafnium (Hf), aluminum (Al), niobium (Nb), tantalum (Ta), chromium (Cr), rhodium (Rh) or bismuth (Bi), and wherein the second layer comprises CoFe or CoFeB.

6. The memory device of claim 1, wherein the coupling layer comprises a coupling of 0.5 erg per square centimeter (erg/cm2) to 3.0 erg/cm2.

7. The memory device of claim 1, wherein the non-magnetic spacer comprises a metallic spacer, and wherein one of the first layer or the second layer comprises a Heusler material.

8. The memory device of claim 1, further comprising a spin-orbit torque (SOT) line on the second side of the free layer, the SOT line comprising alloys of two or more of tungsten (W), platinum (Pt), terbium (Tb), bismuth (Bi), selenium (Se), hafnium (Hf), zirconium (Zr), silver (Ag), gold (Au), and silicon (Si) materials.

9. A memory device, comprising:

a magnetic tunnel junction (MTJ) structure comprising perpendicular shape anisotropy, and the MTJ structure further comprising:

a reference layer comprising a first side and a second side that is opposite the first side of the reference layer;

a non-magnetic spacer comprising a first side and a second side, the first side of the non-magnetic spacer being on the second side of the reference layer and the second side of the non-magnetic spacer being opposite the first side of the non-magnetic spacer; and free layer comprising a first side and a second side, the first side of the free layer being on the second side of the non-magnetic spacer and the second side of the free layer being opposite the first side of the free layer, the free layer further comprising a first layer on the first side of the free layer, a second layer on the second side of the free layer and a coupling layer disposed between the first layer and the second layer, a ratio of thickness of the first layer to a thickness of the first layer and the second layer is less than 0.5, wherein a ratio of a thickness of the free layer to an in-plane lateral dimension of the MTJ structure ranges between a first value and a second value.

10. The memory device of claim 9, wherein the first layer is easier to switch magnetization directions than the second layer.

11. The memory device of claim 9, wherein a saturation magnetization MsFL2 of the second layer being between 2 and 5 times a saturation magnetization MsFL1 of the first layer.

12. The memory device of claim 9, wherein:

the ratio of the thickness of the free layer to the in-plane lateral dimension of the MTJ structure is between 0.5 and 5.0 inclusive, and the in-plane lateral dimension of the MTJ structure ranges from 4 nanometers (nm) to 22 nm inclusive.

13. The memory device of claim 9, wherein the first layer comprises CoFeX or CoFeBX in which X is a diluent element comprising vanadium (V), molybdenum (Mo), titanium (Ti), zirconium (Zr), hafnium (Hf), aluminum (Al), niobium (Nb), tantalum (Ta), chromium (Cr), rhodium (Rh) or bismuth (Bi), and wherein the second layer comprises CoFe or CoFeB.

14. The memory device of claim 9, wherein the coupling layer comprises a coupling of 0.5 erg per square centimeter (erg/cm2) to 3.0 erg/cm2.

15. The memory device of claim 9, wherein the non-magnetic spacer comprises a metallic spacer, and wherein one of the first layer or the second layer comprises a Heusler material.

16. The memory device of claim 9, further comprising a spin-orbit torque (SOT) line on the second side of the free layer, the SOT line comprising alloys of two or more of tungsten (W), platinum (Pt), terbium (Tb), bismuth (Bi), hafnium (Hf), selenium (Se), zirconium (Zr), silver (Ag), gold (Au), and silicon (Si) materials.

17. A memory device, comprising:

a magnetic tunnel junction (MTJ) structure comprising perpendicular shape anisotropy, and the MTJ structure further comprising:

a reference layer comprising a first side and a second side that is opposite the first side of the reference layer;

a non-magnetic spacer comprising a first side and a second side, the first side of the non-magnetic spacer being on the second side of the reference layer and the second side of the non-magnetic spacer being opposite the first side of the non-magnetic spacer, the non-magnetic spacer comprising a metallic spacer; and a free layer comprising a first side and a second side, the first side of the free layer being on the second side of the non-magnetic spacer and the second side of the free layer being opposite the first side of the free layer, the free layer further comprising a first layer on the first side of the free layer, a second layer on the second side of the free layer and a coupling layer disposed between the first layer and the second layer, one of the first layer or the second layer comprises a Heusler material, and a saturation magnetization MsFL2 of the second layer being between 2 and 5 times inclusive of a saturation magnetization MsFL1 of the first layer.

18. The memory device of claim 17, wherein the coupling layer comprises a coupling of 0.5 erg per square centimeter (erg/cm2) to 3.0 erg/cm2 inclusive.

19. The memory device of claim 17, wherein:

the first layer is easier to switch magnetization directions than the second layer, a ratio of a thickness of the free layer to a critical dimension of the MTJ structure is between 0.5 and 5.0 inclusive, and the critical dimension of the MTJ structure ranges from 4 nanometers (nm) to 22 nm.

20. The memory device of claim 17, further comprising a capping layer on the second side of the free layer comprising one or more of magnesium oxide (MgO), tantalum oxide (TaO), niobium oxide (NiO), iridium oxide (IrO), sodium oxide (NaO), rhodium oxide (RhO), or osmium oxide (OsO).

* * * * *